United States Patent
Stuebing et al.

(10) Patent No.: US 7,728,696 B2
(45) Date of Patent: Jun. 1, 2010

(54) HARMONIC TERMINATION OF POWER AMPLIFIERS USING BAW FILTER OUTPUT MATCHING CIRCUITS

(75) Inventors: Carlton Stuebing, Portland, OR (US); Garth G. Sundberg, Portland, OR (US); Walid Y. Ali-Ahmad, Cupertino, CA (US); Hans Dropmann, Emerald Hills, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 36 days.

(21) Appl. No.: 12/236,385

(22) Filed: Sep. 23, 2008

(65) Prior Publication Data
US 2009/0179714 A1    Jul. 16, 2009

Related U.S. Application Data

(60) Division of application No. 11/551,946, filed on Oct. 23, 2006, now Pat. No. 7,598,827, which is a continuation-in-part of application No. 11/471,031, filed on Jun. 19, 2006, now Pat. No. 7,586,389.

(51) Int. Cl.
*H03H 9/54* (2006.01)
*H03H 9/70* (2006.01)
*H03H 7/38* (2006.01)
*H03F 3/21* (2006.01)

(52) U.S. Cl. .................. 333/189; 333/133; 330/302; 330/306

(58) Field of Classification Search ............ 333/133, 333/187, 189, 32; 330/302, 306
See application file for complete search history.

(56) References Cited

U.S. PATENT DOCUMENTS

| | | | | |
|---|---|---|---|---|
| 5,095,285 | A | * | 3/1992 | Khatibzadeh ............ 330/306 |
| 5,146,178 | A | * | 9/1992 | Nojima et al. ............ 330/251 |
| 5,592,135 | A | | 1/1997 | Taguchi et al. |
| 5,883,575 | A | | 3/1999 | Ruby et al. |
| 5,894,647 | A | | 4/1999 | Lakin |

(Continued)

FOREIGN PATENT DOCUMENTS

JP         08-139535 A        5/1996

(Continued)

OTHER PUBLICATIONS

O. Ikata, T. Miyashita, T. Matsuda, T. Nishihara, & Y. Satoh. "Development of Low-Loss Band-Pass Filters Using Saw Resonators for Portable Telephones", 1992, pp. 111-115.

(Continued)

*Primary Examiner*—Barbara Summons
(74) *Attorney, Agent, or Firm*—North Weber & Baugh LLP

(57) ABSTRACT

A system, apparatus and method for providing filtering functionality and impedance transformation within a BAW resonator network are disclosed. In particular, a BAW resonator network is designed to provide bandpass capability and a transformation between its input impedance and output impedance. By effectively integrating impedance matching functionality within the BAW resonator network, discrete impedance matching elements previously required within a system may be removed or reduced in size. As a result, matching networks and their associated component costs, insertion losses, and board size contributions may be reduced. Harmonic termination may be provided within the BAW resonator network or a prematch stage to improve efficiency of a power amplifier.

8 Claims, 24 Drawing Sheets

U.S. PATENT DOCUMENTS

| | | | |
|---|---|---|---|
| 5,942,958 A | 8/1999 | Lakin | |
| 6,091,966 A * | 7/2000 | Meadows | 455/553.1 |
| 6,107,721 A | 8/2000 | Lakin | |
| 6,236,274 B1 * | 5/2001 | Liu | 330/302 |
| 6,262,637 B1 | 7/2001 | Bradley et al. | |
| 6,323,744 B1 | 11/2001 | Barber et al. | |
| 6,351,236 B1 | 2/2002 | Hasler | |
| 6,377,136 B1 | 4/2002 | Rittenhouse et al. | |
| 6,404,302 B1 | 6/2002 | Satoh et al. | |
| 6,420,202 B1 | 7/2002 | Barber et al. | |
| 6,462,631 B2 | 10/2002 | Bradley et al. | |
| 6,472,954 B1 | 10/2002 | Ruby et al. | |
| 6,489,862 B1 | 12/2002 | Frank | |
| 6,542,055 B1 | 4/2003 | Frank et al. | |
| 6,670,866 B2 | 12/2003 | Ella et al. | |
| 6,710,677 B2 | 3/2004 | Beaudion et al. | |
| 6,710,681 B2 | 3/2004 | Figueredo et al. | |
| 6,720,844 B1 | 4/2004 | Lakin | |
| 6,724,263 B2 * | 4/2004 | Sugiura | 330/302 |
| 6,774,857 B2 | 8/2004 | Frank | |
| 6,803,835 B2 | 10/2004 | Frank | |
| 6,879,224 B2 | 4/2005 | Frank | |
| 6,909,340 B2 | 6/2005 | Aigner et al. | |
| 6,924,715 B2 | 8/2005 | Beaudin et al. | |
| 6,933,807 B2 | 8/2005 | Marksteiner et al. | |
| 6,943,647 B2 | 9/2005 | Aigner et al. | |
| 7,057,478 B2 | 6/2006 | Korden et al. | |
| 7,274,270 B2 | 9/2007 | Frank | |
| 7,362,171 B2 * | 4/2008 | Kunihiro | 330/126 |
| 7,459,992 B2 | 12/2008 | Matsuda et al. | |
| 7,586,389 B2 * | 9/2009 | Ali-Ahmad et al. | 333/133 |
| 7,598,827 B2 * | 10/2009 | Stuebing et al. | 333/189 |
| 2002/0153965 A1 | 10/2002 | Ruby et al. | |
| 2003/0092408 A1 | 5/2003 | Frank | |
| 2003/0112098 A1 | 6/2003 | Frank | |
| 2003/0112768 A1 | 6/2003 | Frank | |
| 2003/0210108 A1 | 11/2003 | Karlquist | |
| 2003/0227357 A1 | 12/2003 | Metzger et al. | |
| 2004/0051601 A1 | 3/2004 | Frank | |
| 2004/0052272 A1 | 3/2004 | Frank | |
| 2004/0102172 A1 | 5/2004 | Hendin | |
| 2004/0124952 A1 | 7/2004 | Tikka | |
| 2004/0150293 A1 | 8/2004 | Unterberger | |
| 2004/0248542 A1 | 12/2004 | Heuermann et al. | |
| 2004/0257172 A1 | 12/2004 | Schmidhammer et al. | |
| 2004/0263286 A1 | 12/2004 | Unterberger | |
| 2005/0093653 A1 | 5/2005 | Larson, III | |
| 2005/0093655 A1 | 5/2005 | Larson, III et al. | |
| 2005/0093658 A1 | 5/2005 | Larson, III et al. | |
| 2005/0093659 A1 | 5/2005 | Larson, III et al. | |
| 2005/0110573 A1 * | 5/2005 | Ohnishi et al. | 330/295 |
| 2005/0110598 A1 | 5/2005 | Larson, III | |
| 2005/0128030 A1 | 6/2005 | Larson, III et al. | |
| 2005/0208895 A1 | 9/2005 | Busson et al. | |
| 2006/0091978 A1 | 5/2006 | Wang et al. | |
| 2007/0063766 A1 * | 3/2007 | Kunihiro | 330/51 |

FOREIGN PATENT DOCUMENTS

| | | |
|---|---|---|
| JP | 09-246889 A | 9/1997 |

OTHER PUBLICATIONS

"Filters for Communication Equipment", MuRata Catalog, May 30, 2005, pp. 304-310.

* cited by examiner

Stage by Stage Loading Measurement Method

HARMONIC TERMINATION OF POWER AMPLIFIERS USING BAW FILTER OUTPUT MATCHING CIRCUITS

CROSS REFERENCE TO RELATED PATENT APPLICATION

This application claims is a divisional of U.S. patent application Ser. No. 11/551,946, entitled "Harmonic Termination of Power Amplifiers using BAW Filter Output Matching Circuits," filed on Oct. 23, 2006, now U.S. Pat. No. 7,598,827, which is a continuation-in-part of U.S. patent application Ser. No. 11/471,031, entitled "Impedance Transformation and Filter Using Bulk Acoustic Wave Technology," filed Jun. 19, 2006, now U.S. Pat. No. 7,586,389, which application is incorporated herein by reference in its entirety.

BACKGROUND

A. Technical Field

The present invention relates generally to impedance transformation within an electrical circuit, and more particularly, to the application of bulk acoustic wave (hereinafter, "BAW") technology to provide impedance transformation and filtering functionality within a resonator network.

B. Background of the Invention

The importance of impedance matching within an electrical circuit is well understood within the art. Impedance matching relates to the concept of optimizing a source impedance equal to a target load impedance in order to efficiently deliver a signal from source to load. In particular, the output load impedance seen by a power amplifier should be chosen to optimize the efficiency of that amplifier. This principle of impedance matching is important to numerous technology applications and markets, and the design of electrical circuits therein.

The wireless and Radio Frequency ("RF") market is an example in which impedance matching and transformation is very important in the design of electrical circuits. In fact, the high frequency RF signal may be sensitive to impedance mismatches within an electronic circuit. Electrical component characteristics (e.g., wire inductances, transistor parasitics, interlayer capacitances and conductor resistances) may significantly impact the design of impedance matching elements used to connect these components, or the blocks in which they reside, in a circuit. The design and implementation of a proper impedance matching network within an RF circuit is oftentimes very complex and may require significant cost and board or module area in its implementation.

FIG. 1 illustrates exemplary transmit and receive signal paths within an RF environment. As illustrated, a transmit driver 110 is coupled to a bandpass filter 120 via a first matching element 115. The bandpass filter 120 is coupled to a power amplifier 130 via a second matching element 125. The power amplifier 130 is coupled to a duplexer 150 via a third matching element 143 and a fourth matching element 146.

On the receiver path, the duplexer 150 is coupled to a low noise amplifier 160 via a fifth impedance matching element 155. The low noise amplifier 160 is coupled to a bandpass filter 170 via a sixth matching element or 165. The bandpass filter 170 is coupled to other components within the receiver signal path via a seventh matching element 175.

These matching elements provide an impedance transformation between the components in the electrical circuit. For example, in an RF environment, impedance matching elements may provide an impedance step-up from $3\Omega$ to $50\Omega$ between various components or an impedance step-down from $50\Omega$ to $30\Omega$ depending on which components are being coupled. For example, the third matching network 143 and the fourth matching network 146 may provide such an impedance transformation of $3\Omega$ to $5\Omega$ at the power amplifier 130 output to $50\Omega$ at the duplexer input 150. One skilled in the art will recognize that impedance matching elements may be used to match numerous different impedance values and that a particular impedance transformation may be provided by a single impedance element or multiple impedance elements in various configurations.

The design and implementation of impedance matching impedance elements may significantly increase the complexity of an electrical system and require additional board area and cost in the realization of the system itself. Oftentimes, certain components within an electrical system may need to be located "off-chip" in order properly match the component within the system. These off-chip components provide high "Q" characteristics and very good transformation loss between components. However, the off-chip components also require additional board or module space in their implementation. For example, the design of an electrical circuit may require that one or more impedance matching elements be located outside of an integrated circuit for various reasons including size considerations of the matching element(s), interfacing with out off-chip components, etc. FIG. 2 illustrates one such example of an RF system having off-chip components located on a board and connected to an integrated electrical circuit by one or more matching elements.

FIG. 2 is intended to illustrate one possible scenario related to the RF system shown in FIG. 1. As illustrated, a bandpass filter 230 in the transmit signal path of the RF system is separate from an integrated circuit 220 and located on a radio board 210. The bandpass filter 230 is coupled within the signal path in the integrated circuit by a first matching element 235 and a second matching element 240. A duplexer 250 is coupled to the transmit signal path by a third matching element 255 and to the receiver path by a fourth matching element 260.

One skilled in the art will readily recognize the added complexity and board or module area required to properly couple separate electrical components (e.g., the integrated circuit 220, the bandpass filter 230 and the duplexer 250) using distinct matching elements. Furthermore, the manufacturing costs associated with the electrical systems increase reflected by the fact that the components must be manufactured separately and each installed onto the board 210.

SUMMARY OF THE INVENTION

The present invention provides an apparatus and method for providing an integrated impedance transformation and filtering functionality within a BAW resonator network that may function as an impedance matching element. In particular, a BAW resonator network is considered for purposes of explanation to provide bandpass capability and a transformation between its input impedance and output impedance. The magnitude of the impedance transformation and bandpass characteristics may be modeled and implemented within the BAW resonator network. By effectively integrating impedance matching functionality within the BAW resonator network, discrete impedance matching elements previously required within a system may be removed or reduced in size. As a result, matching elements/networks and their associated component costs, insertion losses, and board or module size contributions may be reduced.

The BAW resonator network may be as a single stage impedance matching network. In one embodiment, a BAW "L" configuration is used to realize both filtering functionality and impedance transformation between the input and output of a single stage BAW L network. In another embodiment, a plurality of single stage BAW L networks is cascaded to provide a multi-stage BAW network. This multi-stage network may provide a larger impedance transformation between its input and output. The multi-stage network may also address shortcomings in the single stage BAW L network such as issues related to insertion and return loss quality as well as mid-band impedance reversals within the filter pass band. Multiple stages can also improve out of band rejection.

The performance and manufacturability of the BAW resonator multi-stage network may depend on the number of available unique resonator stack thickness used within the network. In particular, the impedance transformation magnitude of the multi-stage network improves as the number of available unique series resonant frequencies across the multi-stage network increases. However, as the number of unique resonator stack thicknesses (or unique series resonant frequencies) increases, the complexity and cost of manufacturing the multi-stage network increases.

A BAW resonator network may also be configured in other designs to allow impedance transformation and filtering between its input and output port. For example, BAW resonators may be placed in a Pi configuration, Tee configuration or Lattice configuration. All of these various configurations are intended to fall within the scope of the present invention.

According to various embodiments of the invention, harmonic termination is provided on an output of a power amplifier to improve the efficiency of power delivered to a load, such as by means of a duplexer. In certain embodiments, a shunt harmonic BAW resonator is coupled in parallel to the power amplifier to provide a short on at least one harmonic frequency of the power amplifier. The shunt harmonic BAW resonator may be supplemented with a helper inductor that increases the number of resonating frequencies of that resonator to provide the harmonic termination by adding another short resonance at $1/(2\pi*C_p*L_{helper})$. In other embodiments, a harmonic termination capacitor is integrated within a pre-match stage that interfaces with a BAW resonator impedance network. Depending on the design, even harmonics or odd harmonics are shorted on the power amplifier output. Depending upon the application, single or multiple harmonic short terminations can be used to further improve the efficiency of saturated and linear power amplifiers.

One skilled in the art will recognize that numerous embodiments of the invention may be applied to various technology environments. For example, the present invention may be used to reduce the size of the module or circuit board or obviate impedance matching networks/elements within transmit and receive signal paths that interface with a duplexer or interstate filters in an RF environment.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

A system, apparatus and method for providing filtering functionality and impedance transformation within a BAW resonator network are disclosed. In particular, a BAW resonator network is designed to provide bandpass capability and a transformation between its input impedance and output impedance. By effectively integrating impedance matching functionality within the BAW resonator network, discrete impedance matching networks/elements previously required within a circuit may be removed or reduced in size. As a result, matching networks and their associated component costs, insertion losses, and board size contributions may be reduced.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different electrical components, circuits, devices and systems. The embodiments of the present invention may function in various different types of environments wherein impedance matching is relevant including high frequency RF applications. Structures and devices shown below in block diagram are illustrative of exemplary embodiments of the invention and are meant to avoid obscuring the invention. Furthermore, connections between components within the figures are not intended to be limited to direct connections. Rather, connections between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 3:
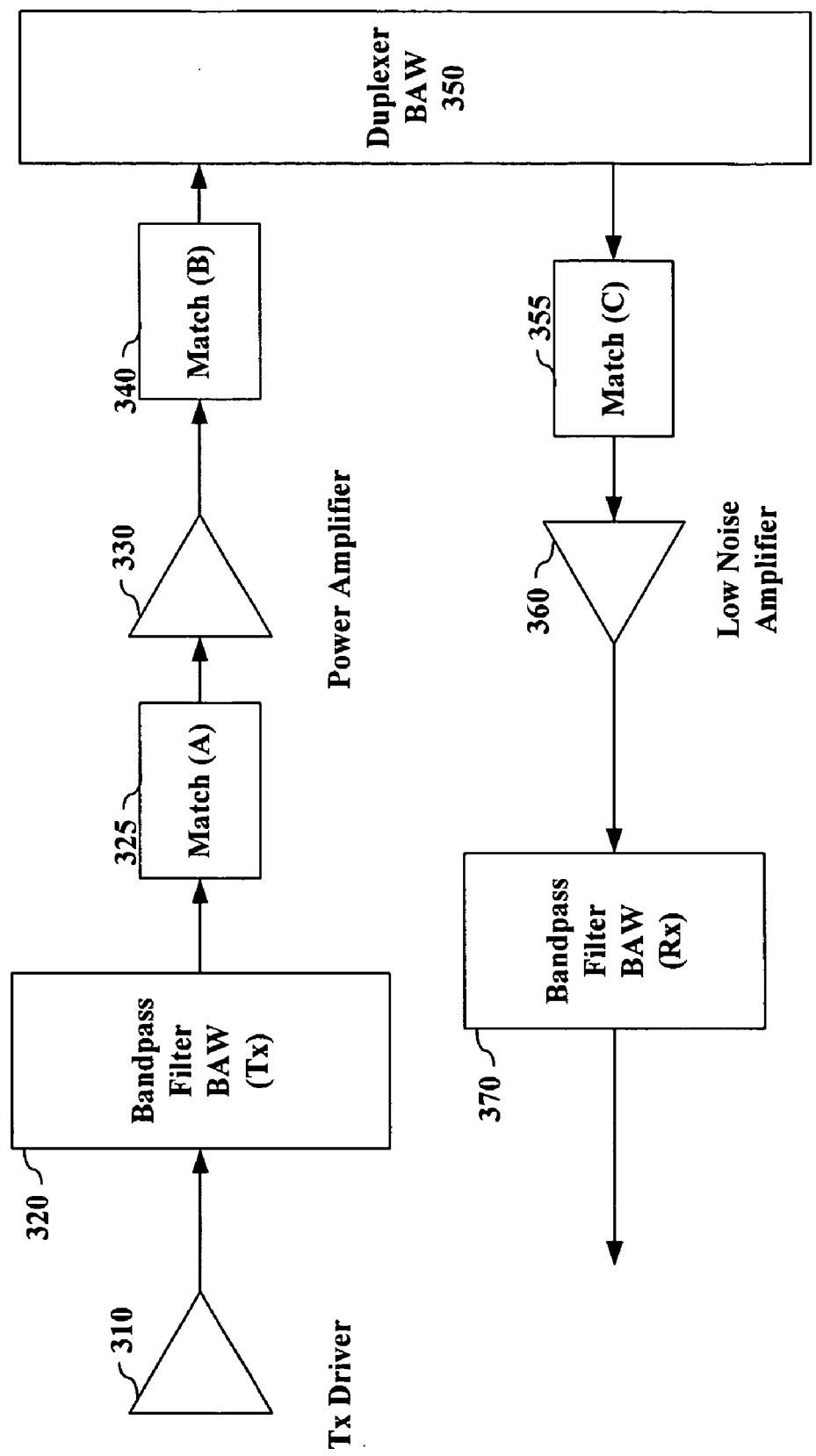
FIG. 3 illustrates an improved RF transceiver system including BAW resonator networks that provide an impedance transformation that reduce the number and/or size of matching elements according to one embodiment of the invention.

A BAW resonator network may be integrated within an electrical component, circuit or system, and modeled to provide a bandpass filter and impedance transformation between its input and output. FIG. 3 is a general illustration of an example in which the present invention may reduce the size or remove the number of discrete impedance matching elements in the system shown in FIG. 1. The impedance transformation magnitude and filtering characteristics depend on a number of factors including the number of unique resonator stack thicknesses (i.e., the number of different series resonant frequencies within the network) within the resonator network.

Figure 1:
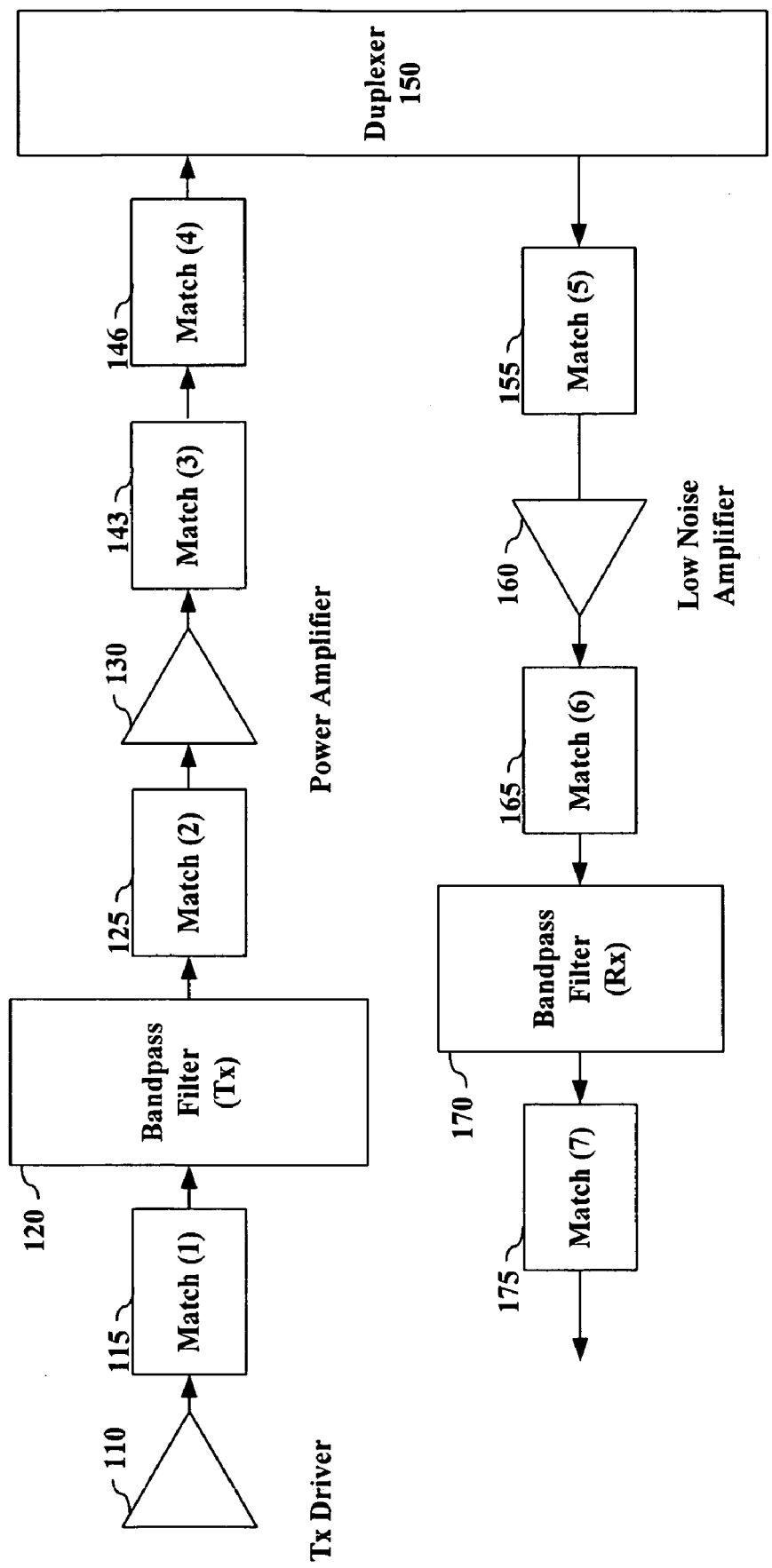
FIG. 1 illustrates an RF transceiver system including components and matching elements coupling the components therein.
Figure 2:
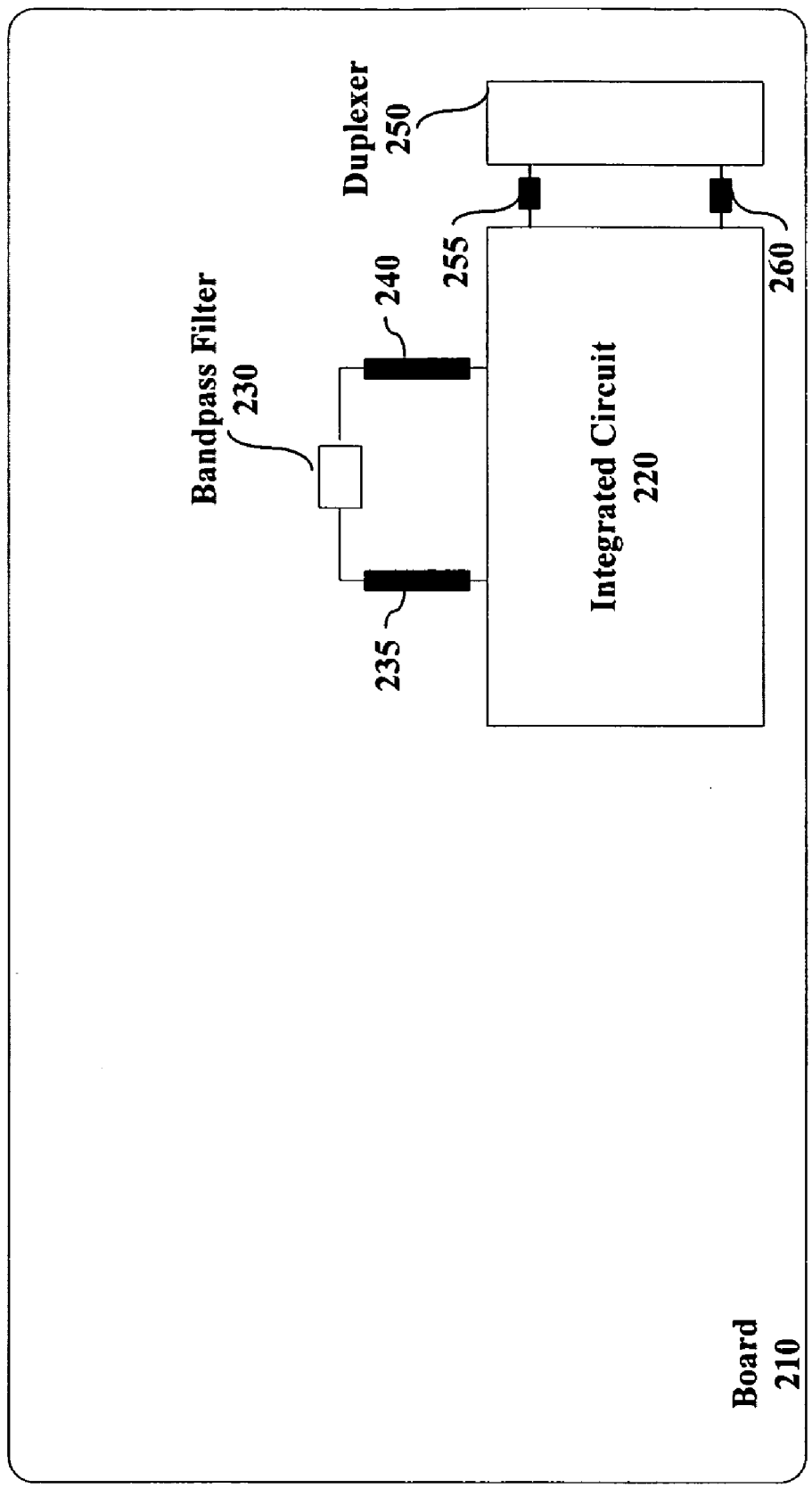
FIG. 2 is a general diagram illustrating an exemplary electrical system having matching elements coupling distinct components located on a radio board.

A review of the system shown in FIG. 3 identifies a reduction in the number of discrete impedance matching elements in relation to the system shown in FIG. 1. Additionally, the remaining discrete impedance matching elements in FIG. 3 are transforming a smaller impedance magnitude than their counterparts in FIG. 1. This reduction in the size and number of discrete impedance matching elements is provided by the integration of certain BAW resonator networks within other components within the system. Accordingly, a significant reduction in the board area required to implement the system is achieved as well as potential improvements in performance.

Referring to FIG. 3, the transmit-side bandpass filter 320 comprises a BAW resonator network that provides both filtering functionality and impedance transformation. In one embodiment, the bandpass filter 320 effectively allows for the removal of a discrete matching element between the filter 320 and driver 310, and a reduction in the impedance transformation between the filter 320 and the power amplifier 330. In an exemplary RF scenario, the bandpass filter 320 provides impedance transformations from 60Ω+j10Ω at its input and 50Ω to 35Ω on its output. These integrated impedance transformations allow for the removal of the first discrete impedance matching element 115 and a reduction in the amount of transformation and corresponding size of the second discrete impedance matching element 125 illustrated in FIG. 1. The smaller discrete impedance matching element 325 (shown in FIG. 3) need only provide an impedance transformation from about 30Ω to approximately 40Ω+j80Ω at the power amplifier 330 as compared to the second impedance element 125 (shown in FIG. 1) which transitions from 50Ω to 40Ω+j80Ω.

The integration of a BAW resonator network and its corresponding filtering and impedance transformation may extend to other components within the system of FIG. 3 including the duplexer 350. A BAW resonator network may be integrated within the duplexer 350 to provide a 30Ω to 50Ω transformation at its input and require a discrete matching element 340 to transition of 4.2Ω+j1Ω to 30Ω from the power amplifier 330 as compared to 4.2Ω+j1Ω to 50Ω in the system illustrated in FIG. 1. Similarly, a BAW resonator network may be integrated on the duplexer 350 output to reduce the magnitude of impedance transformation provided by the impedance matching element 355. Furthermore, a BAW resonator network may be integrated on the receiver-side filter 370 to obviate or reduce the impedance transformation magnitude required at its input and output. In the particular example shown in FIG. 3, the BAW filtering and impedance transformation allows for the removal of discrete impedance matching elements at both its input and output.

Figure 4:
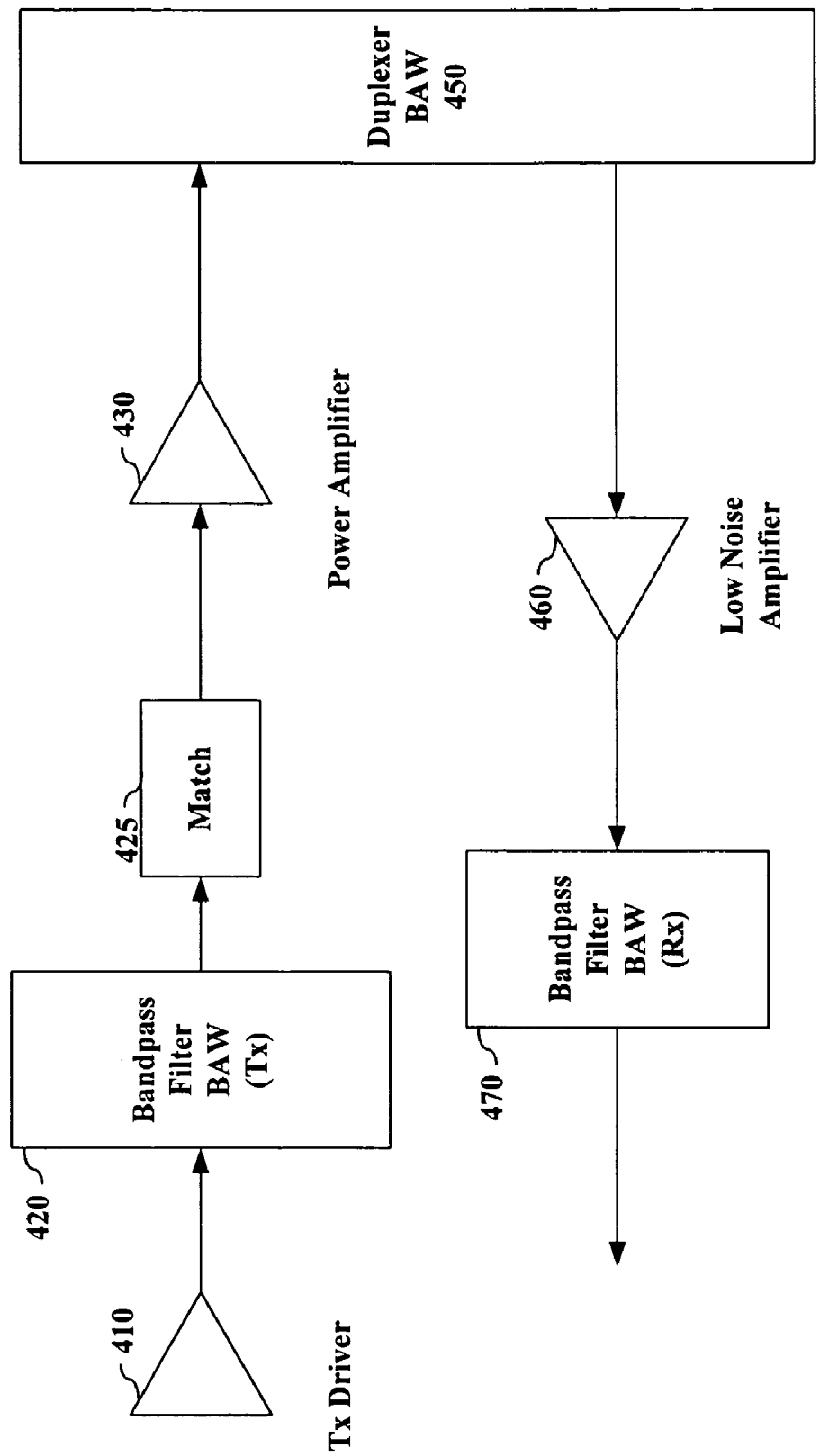
FIG. 4 illustrates a further improved RF transceiver including BAW resonator networks that provide enhanced impedance transformation that even further reduce the number and/or size of matching elements according to one embodiment of the invention.

As previously mentioned, the impedance transformation magnitude depends on the number of unique BAW resonator stack thicknesses within the network. In particular, an increase in the number of different available series resonant frequencies within the network may provide a relatively larger impedance transformation between the network input and output while providing insertion loss competitive with discrete matching networks. FIG. 4 illustrates an exemplary improvement in impedance transformation resulting in a further yet reduction in discrete matching elements and their corresponding sizes.

By way of example, this greater impedance transformation may obviate discrete matching elements at the duplexer 450 input and outputs resulting in direct connections to a power amplifier 430 at its input and a low noise amplifier 460 at its output. Furthermore, this embodiment may further reduce the impedance transformation between the power amplifier 430 and the bandpass filter 420 which allows an even greater reduction in size or complete removal of the matching network/element 425. Further yet, the embodiment may allow for the removal of discrete matching elements between the driver 410 and the transmit-side bandpass filter 420 as well as at the input and output of the receive-side bandpass filter 470.

Figure 5:
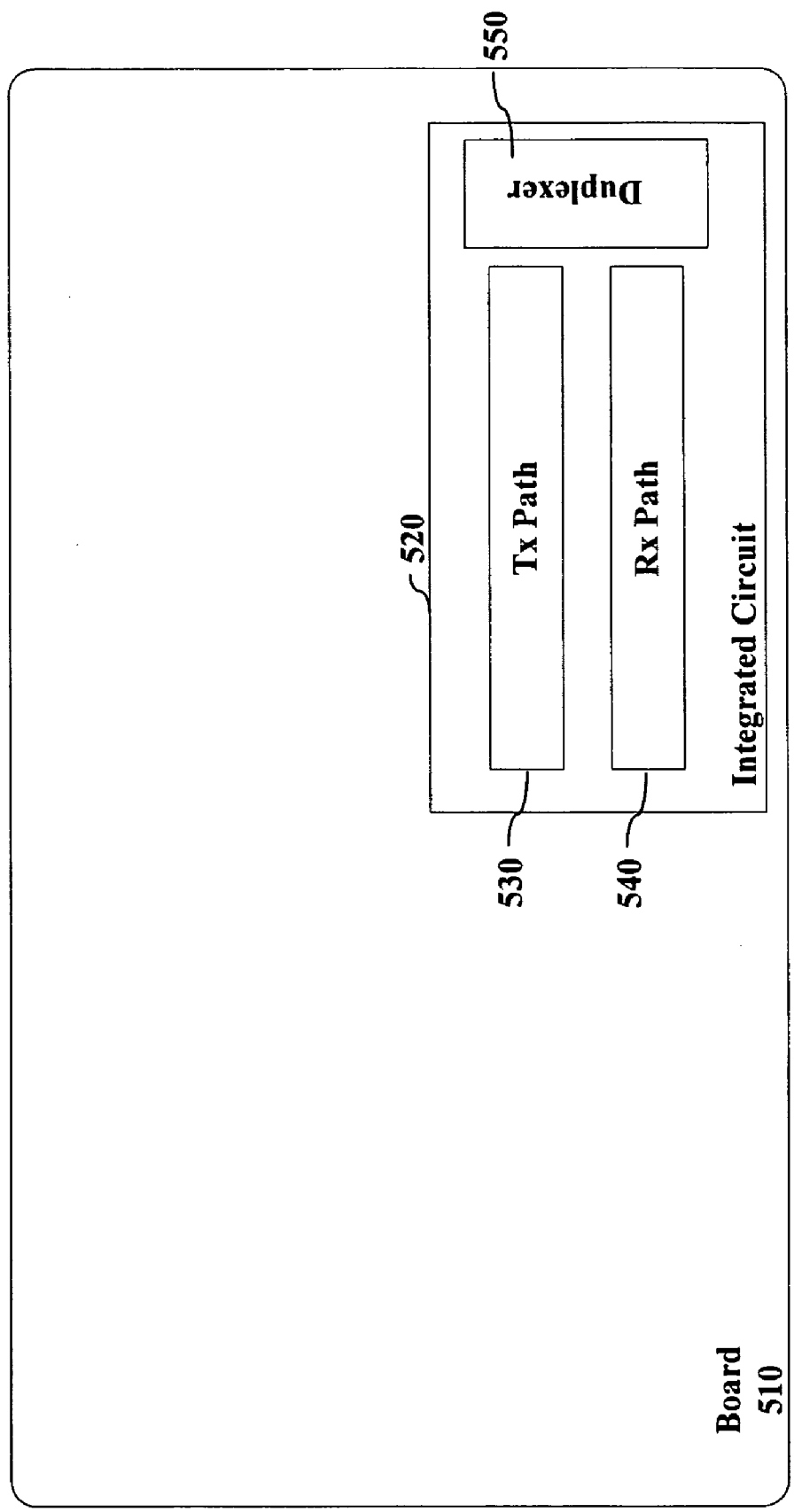
FIG. 5 is a block diagram showing an integrated circuit that obviates the need for off-chip matching elements because of the integrated impedance transformation within BAW resonator networks within the integrated circuit according to one embodiment of the invention.

One skilled in the art will recognize the numerous embodiment and advantages in the application of BAW resonator technology to provide integrated filtering functionality and impedance transformation. One such advantage is illustrated in FIG. 5 which shows an RF circuit having all of its impedance matching elements integrated within the chip. In particular, the complete transmit signal path 530, receiver signal path 540, and duplexer 550 are integrated in a single circuit 520. The removal of off-chip, discrete impedance matching elements, and their associated components, reduces insertion losses, board size contributions, and manufacturing costs.

Although being described above in relation to an RF transceiver circuit, the BAW resonator network, and its corresponding impedance transformation and filtering characteristics, may be applied to numerous types of electrical components and systems. Having illustrated the benefit of integrating both impedance transformation and filtering functionality on an electrical component, a more detailed discussion of certain embodiments of BAW resonator networks is provided below. These embodiments are intended to be exemplary and one skilled in the art will recognize that other BAW resonator network configurations fall within the scope of the present invention.

B. BAW Resonator Filter and Impedance Transformation

Figure 6:
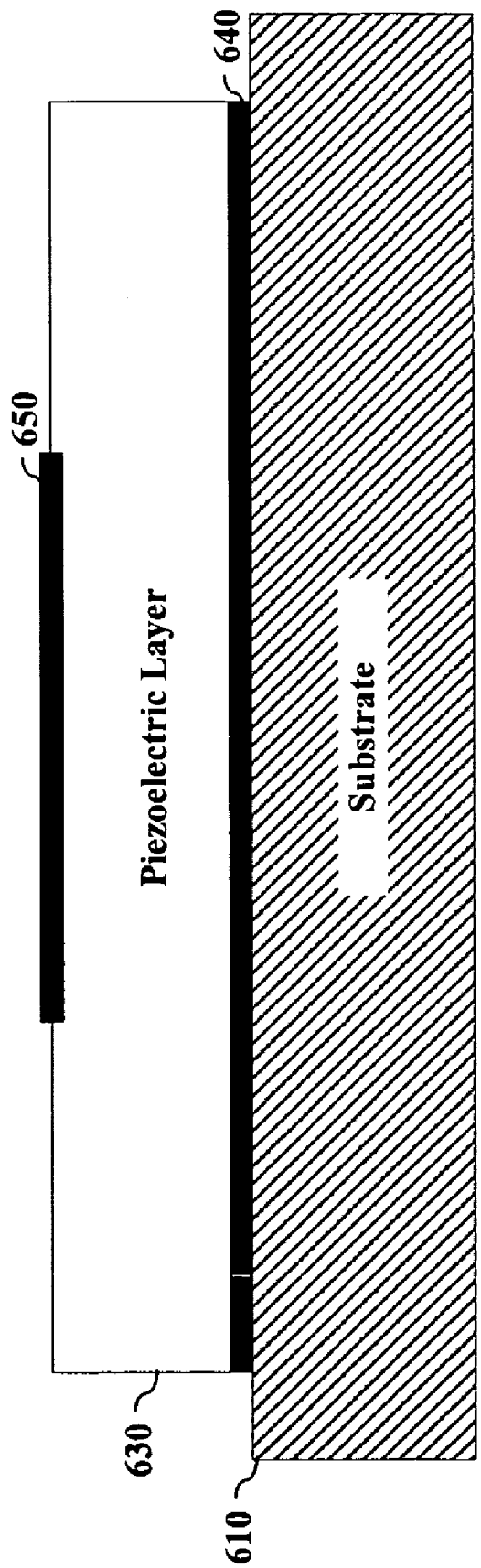
FIG. 6 is a general illustration of a BAW resonator according to various embodiments of the invention.

FIG. 6 generally illustrates a BAW resonator according to one embodiment of the invention. A BAW resonator is placed on a supporting substrate 610 such as silicon, sapphire, glass or alumina. A first electrode 640 and a second electrode 650 are positioned relative to a piezoelectric layer 630, such as a piezoelectric transducer film, to control the response of the piezoelectric material. The piezoelectric layer 630 is deposited on the supporting substrate 610 to allow physical movement, such as vibration, in response to electrical signals. This deposition process may include removal of a supporting substrate or layer to create a membrane that allows the piezoelectric layer to vibrate.

One skilled in the art will recognize that various manufacturing and configuration techniques may be employed to create a BAW resonator. For example, film bulk acoustic resonators ("FBAR") may employ an air gap or an etched away substrate below the piezoelectric to allow unimpeded vibration. A solidly mounted resonator ("SMR") uses a reflective layer(s) to isolate the piezoelectric material from the supporting substrate, thereby allowing desired resonance characteristics.

A BAW resonator network may be designed to provide filtering functionality. In particular, BAW resonators within a network may be modeled to provide a particular response to a band of frequencies, effectively forming a bandpass filter or notch filter. The BAW resonator network may be may be designed to also provide an internal impedance progression or regression. One manner in which internal impedance transformation within a BAW resonator network may be designed is by adjusting the BAW resonator stack thicknesses of certain BAW resonators within the network. The stack thickness of a BAW resonator affects both the series resonant frequency ($F_S$) and the parallel resonant ($F_P$) associated with the resonator. As a BAW resonator network increases the number of its unique available resonant frequencies (both $F_s$ and $F_p$), the potential magnitude of its impedance transformation increases given a reasonable amount of allowable insertion loss.

A relationship exists between the number of available resonant frequencies and the impedance transformation losses associated with the BAW resonator network. This relationship may be considered in designing resonator networks to achieve a desired loss per transformation ratio of the network.

1. BAW Filter Model

A BAW resonator may be modeled using an RLC circuit in which a static capacitance is in parallel with a motional series capacitance and inductance. The resonant frequency $F_S$ of the resonator is defined by the characteristics of the motional capacitance and inductance, which resonates to a short circuit frequency within the model. The motional capacitance and inductance represent the motion of the piezoelectric material within the resonator. The electrical analogous components would have a very small capacitance (i.e., 100 fF) for the motional capacitor and a very large inductance (i.e., 100 nH) for the motional inductor.

The static capacitance represents the parallel plate parasitic electrical capacitance of the piezoelectric material in a static state wherein it defines a parallel resonance mode which operates resonates similar to an open circuit. The electrical analogous component would have a large plate capacitance (i.e., 1 pF) for the static capacitance.

Figure 7:
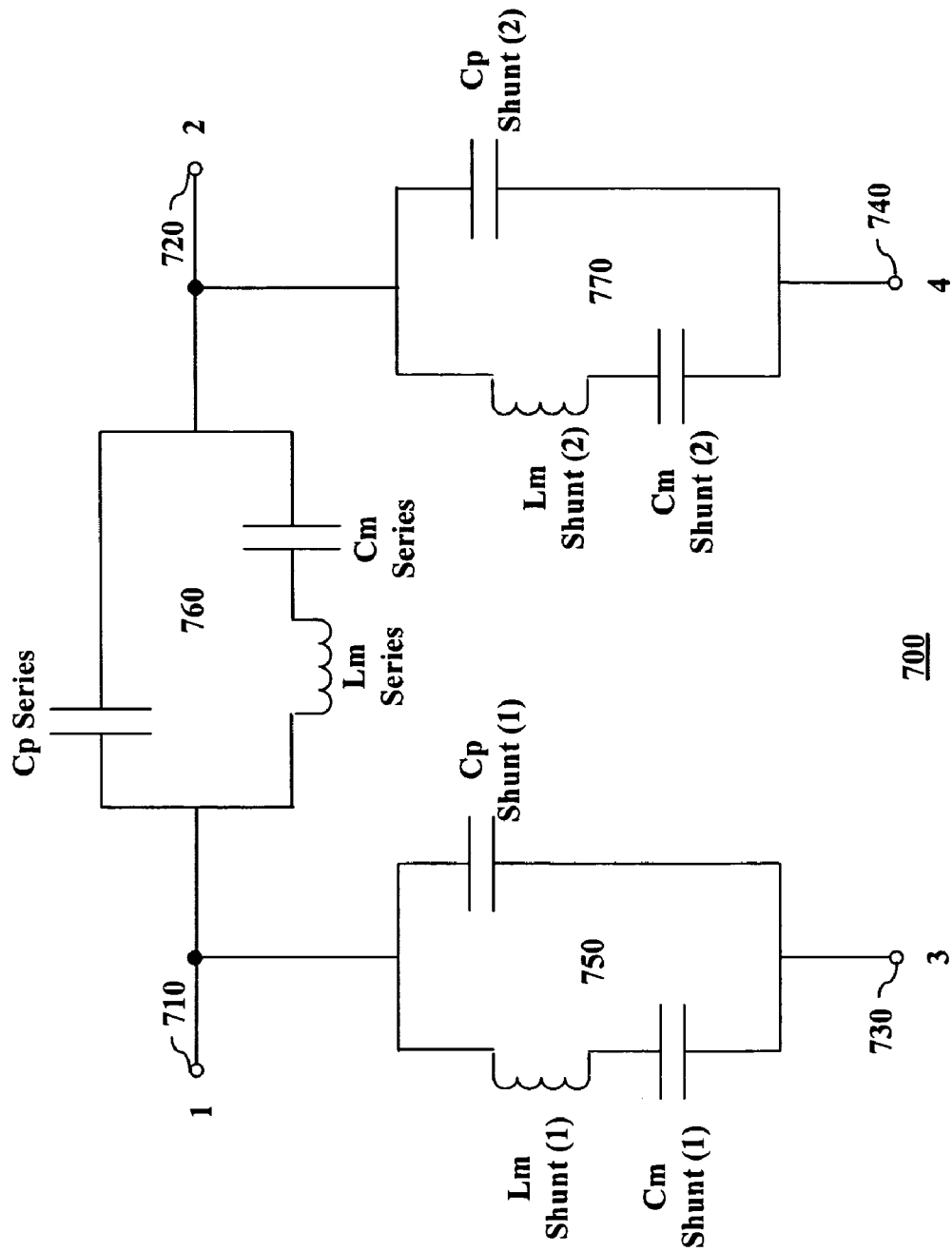
FIG. 7 shows a BAW Pi configuration circuit that models the performance of a BAW filter according to one embodiment of the invention.

An electrical model for a BAW resonator network may be generated using the above-described resonator model. Various configurations, such as a pi configuration or a tee configuration, may be used to effectively design and conceptualize the BAW resonator network characteristics. FIG. 7 illustrates an exemplary pi configuration in which the filtering functionality of the BAW filter is modeled according to one embodiment of the invention.

Referring to FIG. 7, port 1 710 is the input and port 2 720 is the output of the circuit model. Port 3 630 and port 4 640 may be coupled to a plurality of different devices including both helper inductors and electrical ground. In operation of the model, the shunt resonator will resonate to a short below the lower band edge frequency corresponding to the series resonant frequency or self resonant frequency. This shorting of the shunt resonators results in a lower stop band rejection response which is a characteristic of ladder filters. This response is similar to a Pi switch network wherein the shunt switches are shorted and the series switch is substantially resistive.

In the middle of the pass band and to the first order, the shunt resonators go anti-resonate ($F_P$ of the shunt resonators) so that they do not load the signal path. At approximately but not necessarily exactly the same frequency near the middle of the pass band, the series resonator reaches resonate frequency $F_S$ and provides a low resistance for the signal path. In the middle band, the BAW Pi network resembles a Pi switch network with the series elements shorted and the shunt elements opened.

Just above the pass band, the series BAW goes nearly open, which resembles a Pi network with the series element open and the shunt switch element substantially capacitive. Accordingly, a sharp stop band response is produced above the pass band.

2. BAW Impedance Transformation Model

Figure 8:
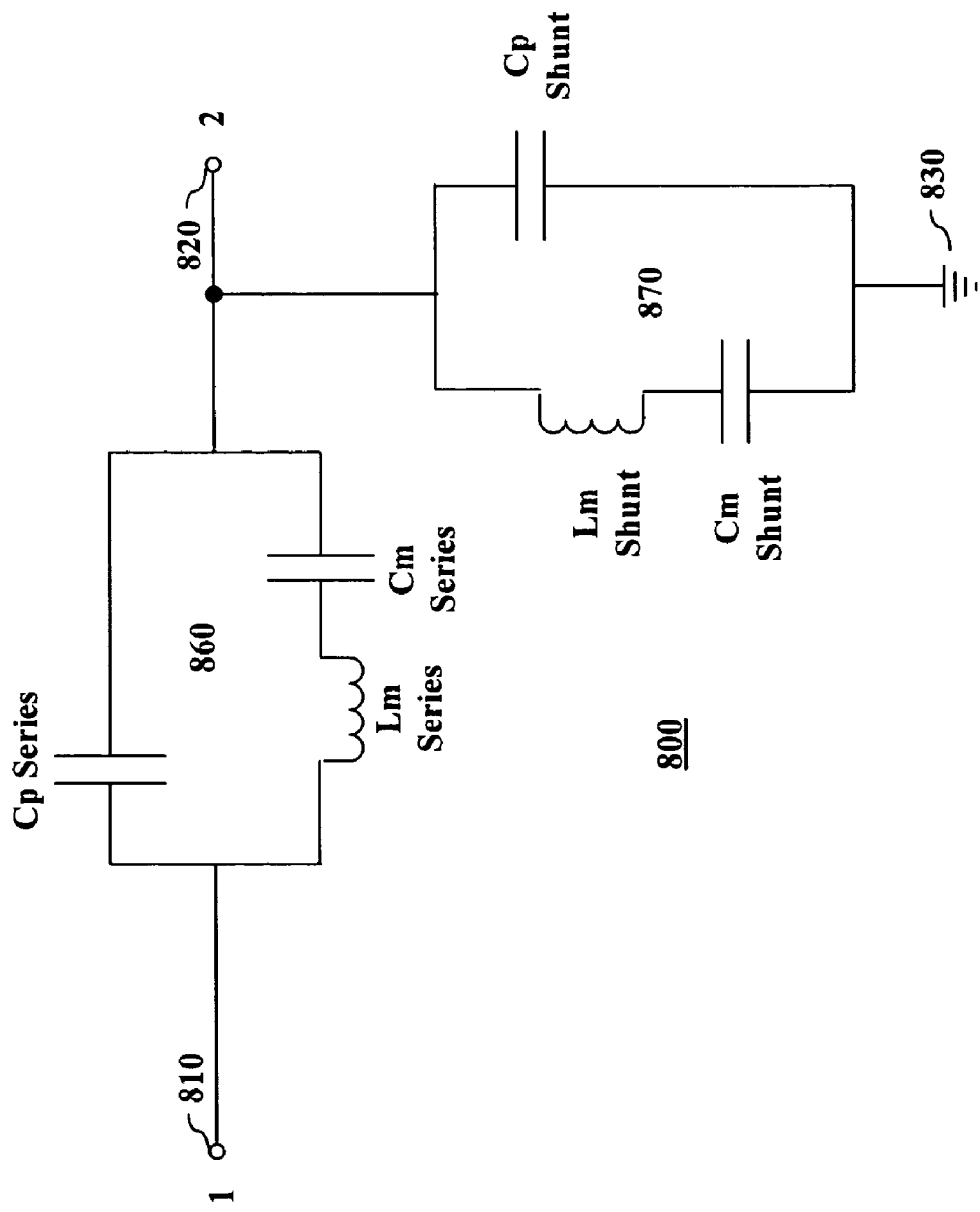
FIG. 8 illustrates a single stage BAW L network that may be used to model filter performance and impedance transformation according to one embodiment of the invention.

As mentioned above, the BAW network may be configured to provide an impedance transformation between its input and output. FIG. 8 illustrates one configuration in which this impedance transformation may be realized. In this embodiment of the invention, a single stage BAW resonator network is designed in an "L" configuration resulting in impedance transformation between its input and output.

Referring to FIG. 8, a first BAW resonator 860 is disposed between the BAW L network configuration 800 input 810 and output 820. A second BAW resonator 870 is disposed between the output 820 and ground 830. Depending on the characteristics of the first BAW resonator 860 and the second BAW resonator, a particular impedance transformation is achieved between the input 810 and the output 820. One skilled in the art will recognize that other BAW configurations may also provide impedance transformations and fall within the scope of the present invention.

In one embodiment of the invention, the single stage BAW L network 800 operates in seven modes depending on the frequency of the signal. These different modes have both varying filtering functionality and impedance transformation characteristics.

A first mode occurs when the signal frequency is well below the pass band (i.e., $F<F_s$ shunt ("$F_{sp}$")) resulting in the first resonator 860 functioning as a capacitor and the second resonator 870 also functioning as a capacitor. In this mode, the dominant reactance in the first resonator 860 is equal to the sum of $C_p$ series and $C_m$ series. The dominant reactance in the second resonator 870 would be equal to $C_p$ shunt and $C_m$ shunt value. There is no impedance transformation associated with the first mode and the signal frequency is filtered as it falls below the pass band, because series and shunt resonators out of resonance define a capacitive voltage divider.

A second mode occurs when the signal frequency is equal to or approximately equal to the lower stop band (i.e., $F{\sim}F_{sp}$) resulting in the first resonator 860 functioning as a capacitor and the second resonator functioning as a short between the output 820 and ground 830. The dominant reactance in the first resonator 860 is determined by $C_p$ series plus $C_m$ series. There is no impedance transformation associated with the second mode and the signal frequency is filtered.

A third mode occurs when the signal frequency is at or approximate to the lower pass band (i.e., $F_{sp}<F<F_p$ shunt ("$F_{pp}$")$\sim F_s$ series ("$F_{ss}$")) resulting in the first resonator 860 functioning as a capacitor and the second resonator 870 functioning as an inductor. The dominant reactance in the first resonator 860 is determined by the sum of $C_p$ series and $C_m$ series. The effective inductance in the second resonator 870 in this frequency range is determined largely by $L_m$ shunt. In this third mode, the signal is passed through the filter and an impedance transformation occurs between the input 810 and the output 820. It is important to note that this impedance transformation may include both real and imaginary components.

A fourth mode occurs when the signal frequency is at or approximate to the mid-band of the pass band (i.e., $F{\sim}F_{pp}{\sim}F_{ss}$) resulting in the first resonator 860 functioning like a short between the input 810 and the output 820, and the second resonator 870 functioning like an open switch. The signal is passed through the bandpass filter and there is no impedance transformation between the input 810 and output 820.

A fifth mode occurs when the signal frequency is at or approximate to the upper pass band (i.e., $F_{pp}{\sim}F_{ss}<F<Fp$ series ("$F_{ps}$")) resulting in the first resonator 860 functioning like an inductor and the second resonator 870 functioning like a capacitor. The dominant reactance in the first resonator 860 is $L_m$ series. The dominant reactance in the second resonator 870 is $C_p$ shunt. In this fifth mode, the signal is passed through the filter and an impedance transformation occurs between the input 810 and the output 820.

The sixth mode occurs when the frequency is at or approximate to the upper stop band (i.e., $F{\sim}F_{ps}$) resulting in the first resonator 860 functioning like an open switch and the second resonator 870 functioning like a capacitor. The dominant reactance in the second resonator 870 is $C_p$ shunt. In this sixth mode, there is no impedance transformation and the signal frequency is attenuated.

The seventh mode occurs when the frequency is well above the pass band (i.e., $F{\gg}F_{ps}$) resulting in the first resonator 860 functioning as a capacitor and the second resonator 870 functioning as a capacitor. The effective capacitance in the first resonator 860 is roughly $C_p$ series. The effective capacitance in the second resonator 870 is roughly $C_p$ shunt. There is no useful impedance transformation associated with the seventh mode and the signal frequency is attenuated it falls above the pass band since the out of resonance resonators serve to capacitively divide down the signal amplitude.

Although the present invention has been described in relation to seven operating modes of a single stage L BAW network configuration, one skilled in the art will recognize that impedance transformation using BAW technology may be achieved using other configurations having a different number of operating modes.

C. BAW Filter and Impedance Performance

Figure 9B:
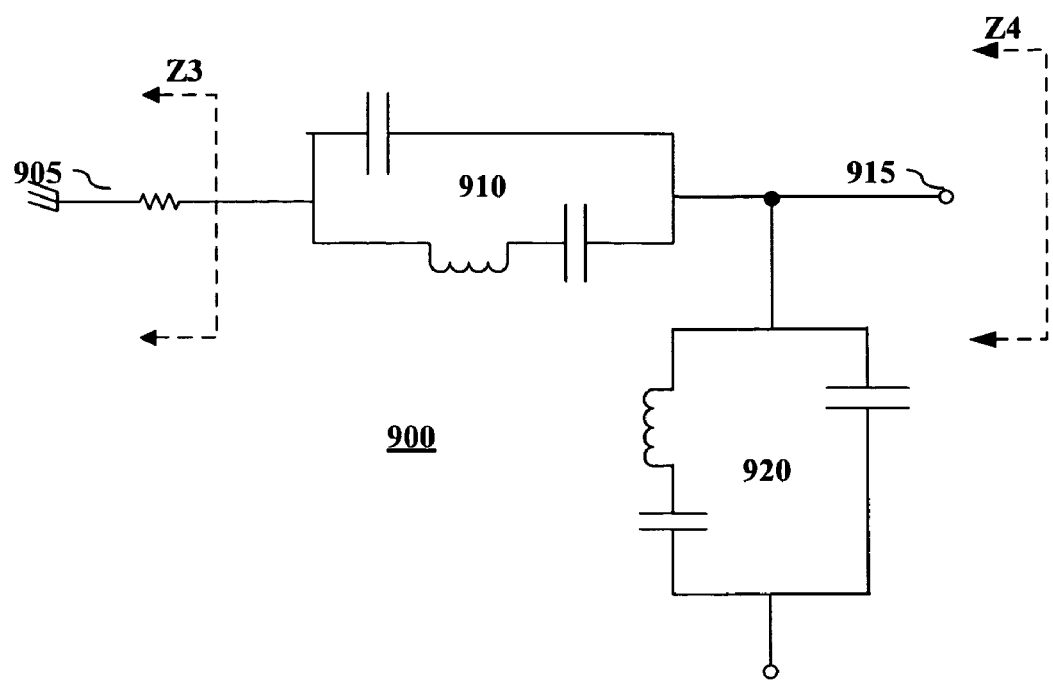
FIGS. 9A and 9B illustrate stage loading measurement locations within a single-stage BAW L configuration network according to one embodiment of the invention.
Figure 9A:
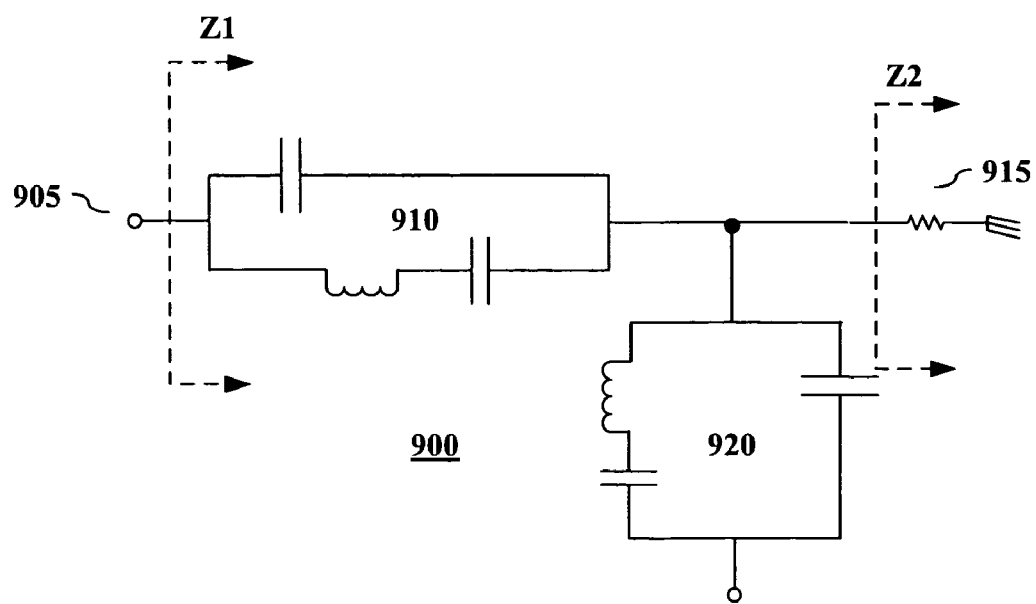
Figure 10:
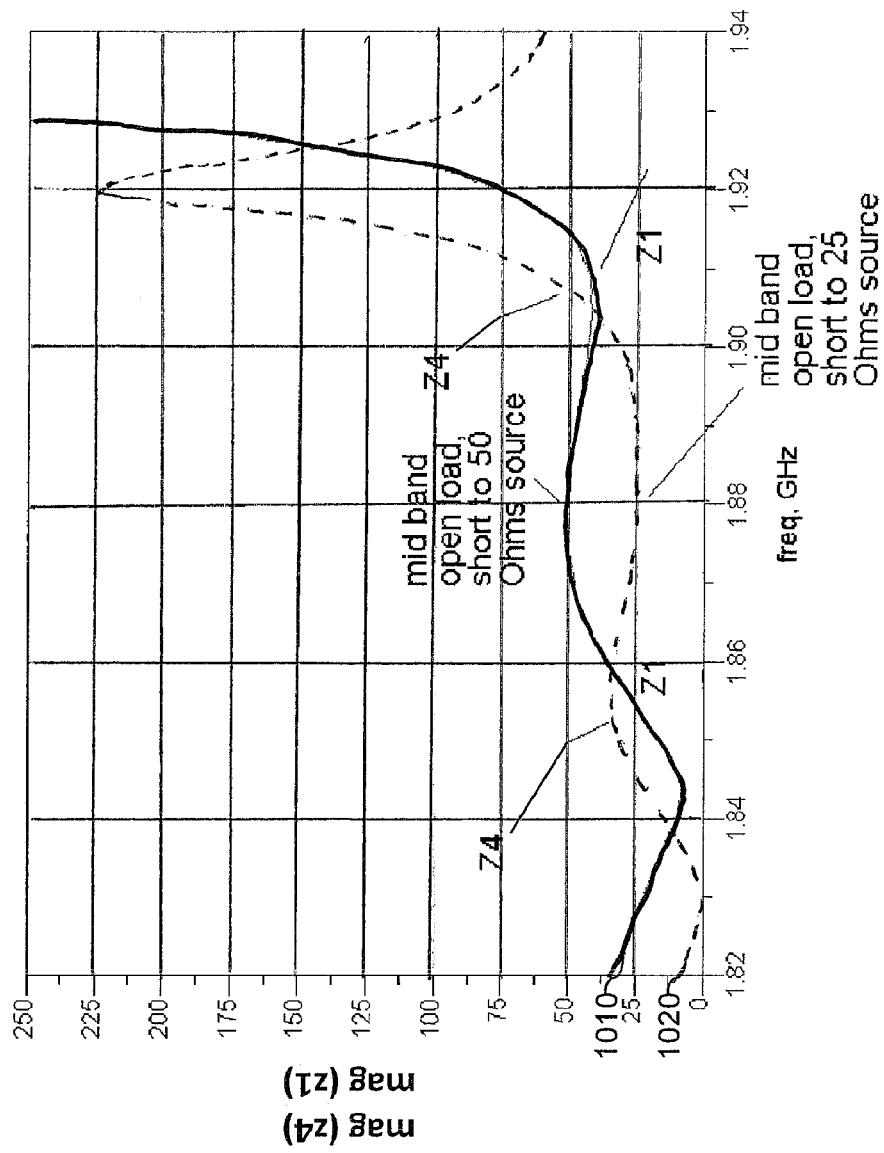
FIG. 10 is a plot illustrating a relationship between impedance and frequency relative to the single stage BAW L network shown in FIGS. 9A and 9B.
Figure 11:
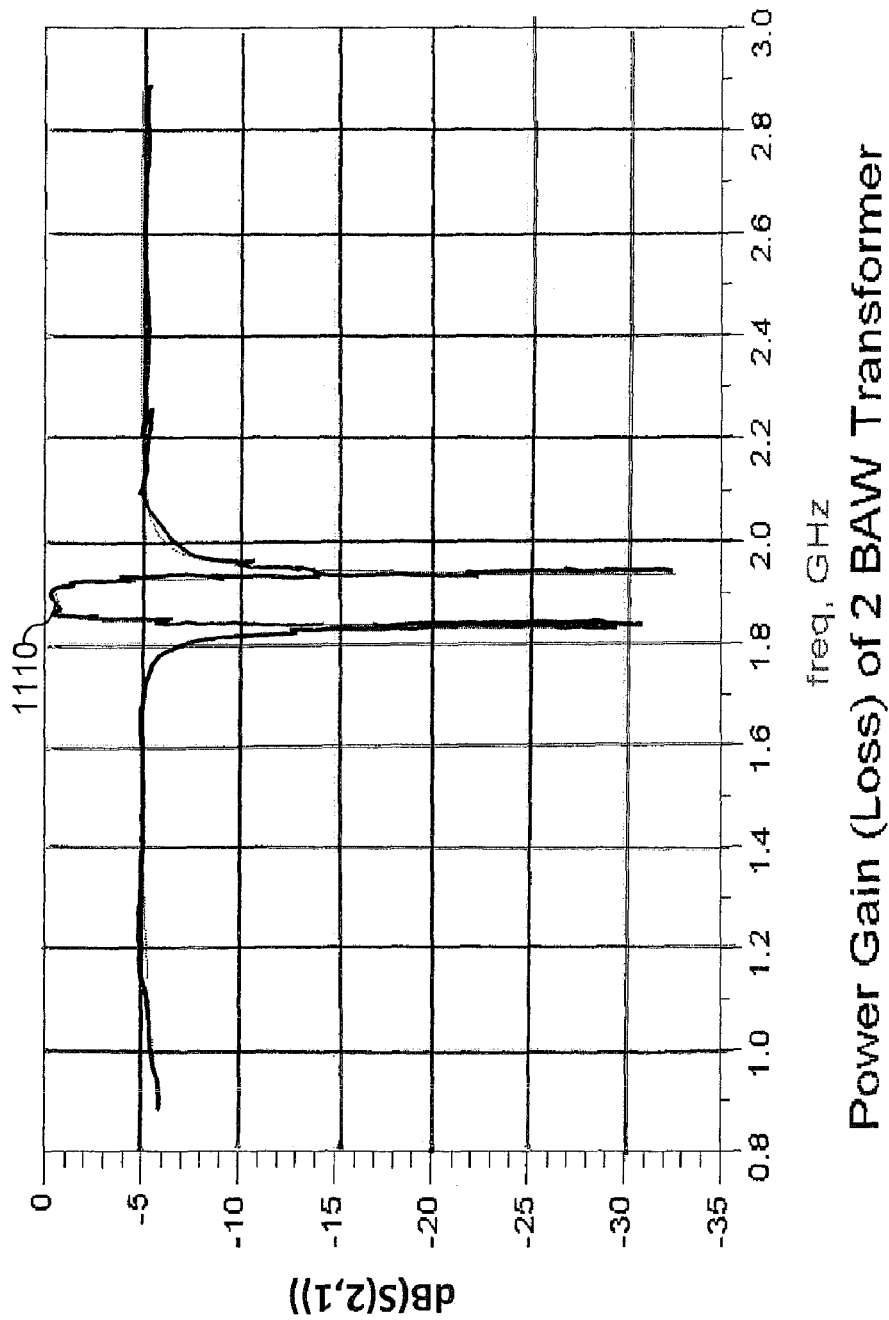
FIG. 11 is a plot illustrating bandpass filtering characteristics of the single-stage BAW L network shown in FIGS. 9A and 9B.

FIGS. 9-11 illustrate an example of the filtering and impedance transformation performance of single stage BAW L network device according to one embodiment of the invention.

Referring to FIG. 9A, a single stage BAW L network 900 is shown having a first BAW resonator 910 and a second BAW resonator 920. Stage loading is illustrated in which a first impedance Z1 and a second impedance Z2 are used to explain an impedance transformation from the first port 905 and the second port 915. Referring to FIG. 9B, the BAW L network 900 is illustrated in which a third impedance Z3 and a forth impedance Z4 are used to explain an impedance transformation from the second port 915 to the first port 905.

For purposes of this example, the second BAW resonator 920 output is grounded (e.g., may be done using a helper inductor). The second port 915 will be defined as the higher impedance port and the first port 905 will be defined as the lower impedance port. In one embodiment of the invention, the second port 915 may have a 50Ω impedance and be connected to an antenna side of a duplexer, and the first port 910 may have a 25Ω impedance and be connected to another device.

Referring to FIG. 10, impedance transformation progression and regression between 50Ω and 25Ω is explained. The x-axis of the plot is frequency in gigahertz and the y-axis is an impedance magnitude. A first trace 1010 shows an impedance progression from approximately 25Ω to 50Ω between the first port 910 and the second port 915. A second trace 1020 shows an impedance digression from 50Ω to 25Ω between the first port 910 and the second port 915.

Referring to FIG. 11, the filtering characteristics of the BAW L network are explained showing a bandpass filter. The x-axis is frequency in gigahertz and the y-axis is gain magnitude. Upon review of this plot, one skilled in the art will recognize that a bandpass filter is realizes with a pass band 1110 with a center frequency at approximately 1.88 GHz.

An input frequency is swept from $F_s$ shunt (lower stop band) to $F_p$ series (upper stop band) to allow explanation of the single stage BAW L network response. As generally discussed above in relation to the various modes of operation, the first resonator 910 is below its series resonance during this sweep; therefore $1/(2\pi*f*C_m series)$ dominates $2\pi*f*L_m series$ resulting in the first resonator 910 being capacitive. The second resonator 915 goes from a short circuit or nearly a short circuit (i.e., $L_m$ shunt and $C_m$ shunt are series resonant shunt loads) to an inductive load (i.e., $2\pi*f*L_m$ shunt dominates $1/(2\pi*f*C_p \text{shunt})$). At the low end of the pass band, an impedance transformation regression from the second port 915 (in this embodiment having 50Ω impedance value) may be defined having a shunt inductive load and a series capacitance.

In the middle of the pass band, the single stage BAW L network behaves much like a Pi or Tee network. In particular, the first resonator 910 becomes a switch nearly in the ON position and the second resonator 920 becomes a switch nearly in the OFF position. Accordingly, in a narrow range of the middle of the band, the BAW L network does not provide a preferred impedance transformation. As will be discussed later, a multi-stage BAW L network may be used to compensate for this issue.

At the top of the pass band, the reactive impedances of the both the first resonator 910 and the second resonator 920 become reversed from the bottom of the pass band. Because the signal frequency is above $F_p$ of the second resonator 920, the second resonator 920 becomes a capacitive load. In other words, the admittance of the second resonator 920 may be approximated as $C_p//L_m$ ($C_p$ in parallel with $L_m$) since the frequency is well above $F_p$ such that $1/(2\pi*f*C_p\text{shunt}) \ll 2\pi*f*L_m\text{shunt}$. The admittance of $C_p//L_m$ becomes dominated by $2\pi*f*C_p$ shunt over $1/(2\pi*f*L_m$ shunt). Likewise, because the frequency is above the resonant frequency $F_s$ of the first resonator 910, the first resonator 910 impedance is dominated by $2\pi*f*L_m$ series over $1/(2\pi*f*C_m$ series). Since the signal frequency is below $F_p$ of the first resonator 910, $2\pi*f*C_p$ series does not dominate the admittance of the first resonator 910 and it becomes inductive. Accordingly, in the upper portion of the pass band, an impedance transformation regression is realized by the low pass filter characteristics (i.e., inductive first resonator 910 and capacitive second resonator 920).

The single stage BAW L network provides a good insertion loss and impedance transformations at both upper and lower bands of the pass band. However, the middle band of the pass band provides an impedance reversal. One manner in which this impedance reversal may be addressed is by cascading multiple single stage BAW L networks into a multi-stage BAW L network. This multi-stage BAW L network may also produce a larger impedance transformation than the single stage BAW L network. For example, the multi-stage BAW L network may significantly reduce or obviate entirely the matching network between a power amplifier (approximately 3Ω) and a commercial duplexer (approximately 50Ω) in the RF environment previously described.

1. Multi-Stage BAW L Network Performance

Figure 12:
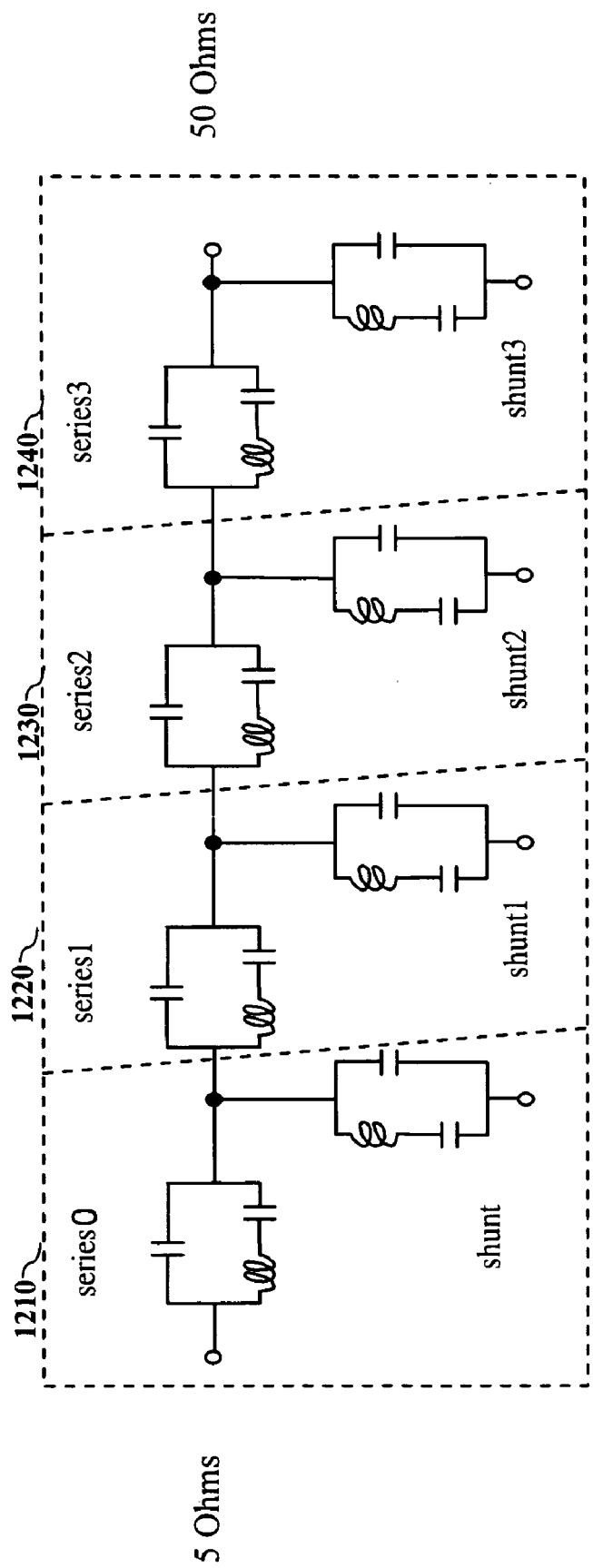
FIG. 12 illustrates a multi-stage BAW L network that provides both filtering and impedance transformation functionality according to one embodiment of the invention.

FIG. 12 illustrates a four stage BAW network according to one embodiment of the invention. In this particular embodiment, a first stage 1210 provides an impedance transformation progression between its input (e.g., having an impedance of 5Ω) and its output, which is coupled to a second stage 1220. The second stage 1220 also provides an impedance transformation between its input and output, which is coupled to a third stage 1230. The third stage 1230 provides a further impedance transformation between its input and output, which is coupled to a fourth stage 1240. The fourth stage 1240 provides a further yet impedance transformation between its input and output (e.g., having an impedance of 50Ω).

One skilled in the art will recognize that various impedance transformation magnitudes may be realized by the number of stages within the BAW network and the specific impedance transformation characteristics of the various stages within the network.

Figure 13:
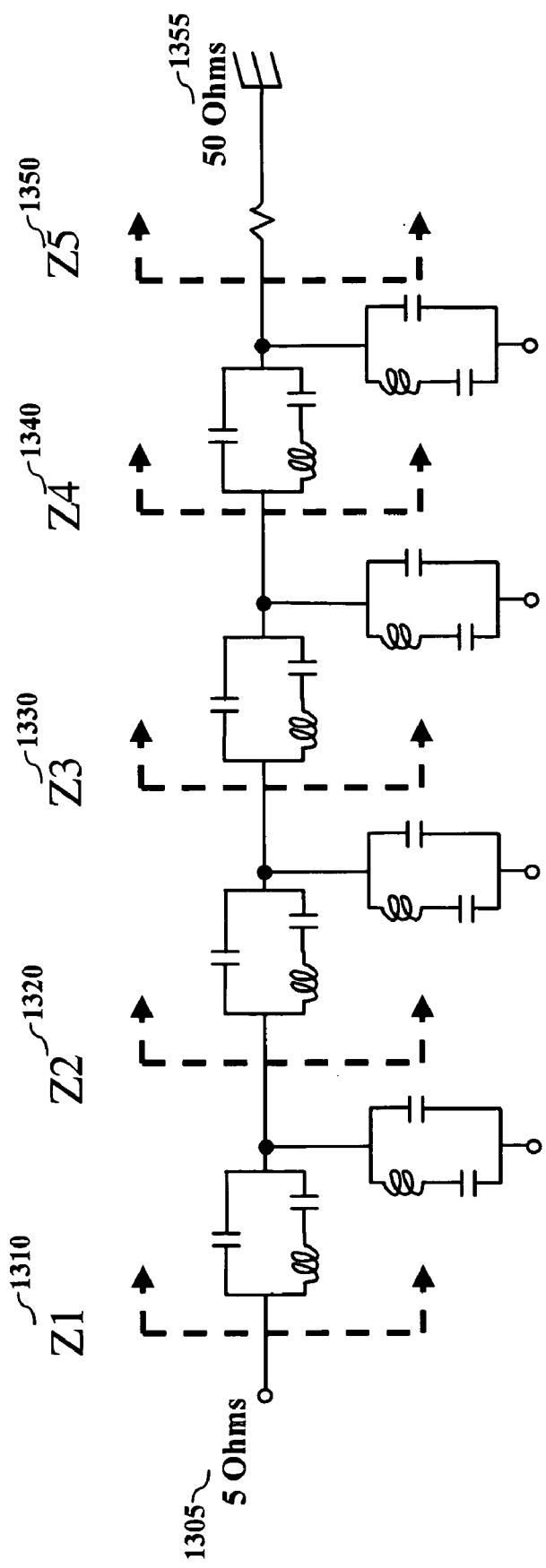
FIG. 13 illustrates stage-by-stage loading measurement locations within a multi-phase BAW L network according to one embodiment of the invention.

For purposes of explanation, FIG. 13 illustrates multiple impedance points within a multi-stage BAW L network according to one embodiment of the invention. The multi-stage BAW L network addresses the above-described limitations of a single stage BAW L network. In this particular example, an impedance progression from 5Ω at the input 1305 to 50Ω at the output 1355 is illustrated. The multi-stage BAW L network may be realized in accordance with various implementations of the invention including a first implementation in which two BAW resonator stack thicknesses are used in the manufacturing of the network. A second implementation of the present invention improves the performance of the multi-stage BAW L network but requires additional BAW resonator thicknesses be used in the manufacturing of the network. Each of these implementations and associated performance aspects will be described below.

Referring to FIG. 13, a first impedance measurement point Z1 1310 is shown at the input of the first stage of the BAW L network. A second impedance measurement point Z2 1320 is shown between the first and second stages. A third impedance measurement point Z3 1330 is shown between the second and third stages. A fourth impedance measurement point Z4 1340 is shown between the fourth and fifth stages. A fifth impedance measurement point Z5 1350 is shown at the output of the fifth stage.

The performance characteristics, including both the magnitude of impedance transformation and filtering aspects, of the multi-stage BAW L network depends on the extent of variance between the resonant frequencies of the series resonators within each stage. In particular, the magnitude of impedance transformation and quality of insertion and return loss can be improved as the number of different available series resonant frequencies within the multi-stage network increases.

Figure 14:
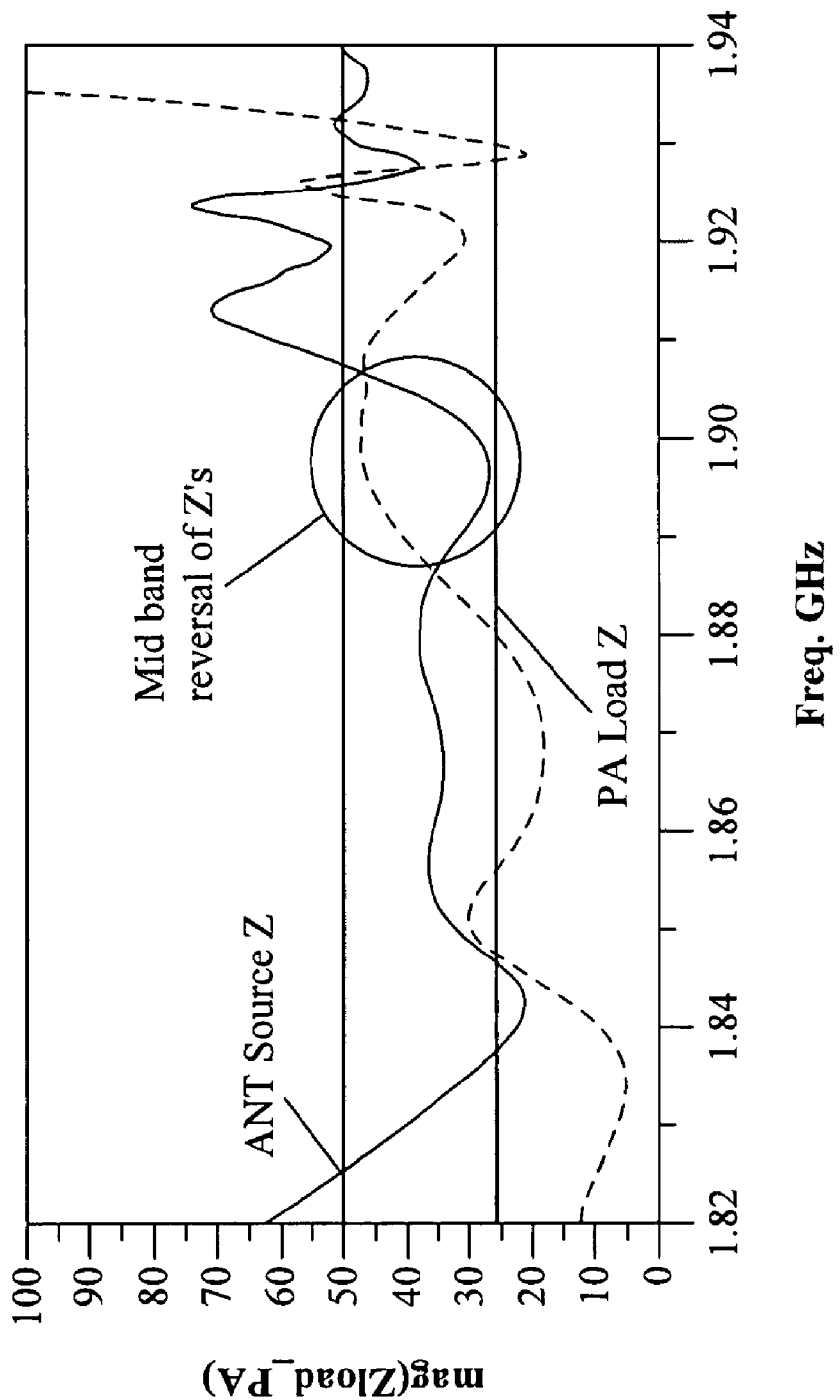
FIG. 14 is a plot illustrating a relationship between impedance and frequency relating to the multi-phase BAW L network having no more than two different resonator stack thicknesses on a substrate according to one embodiment of the invention.
Figure 15:
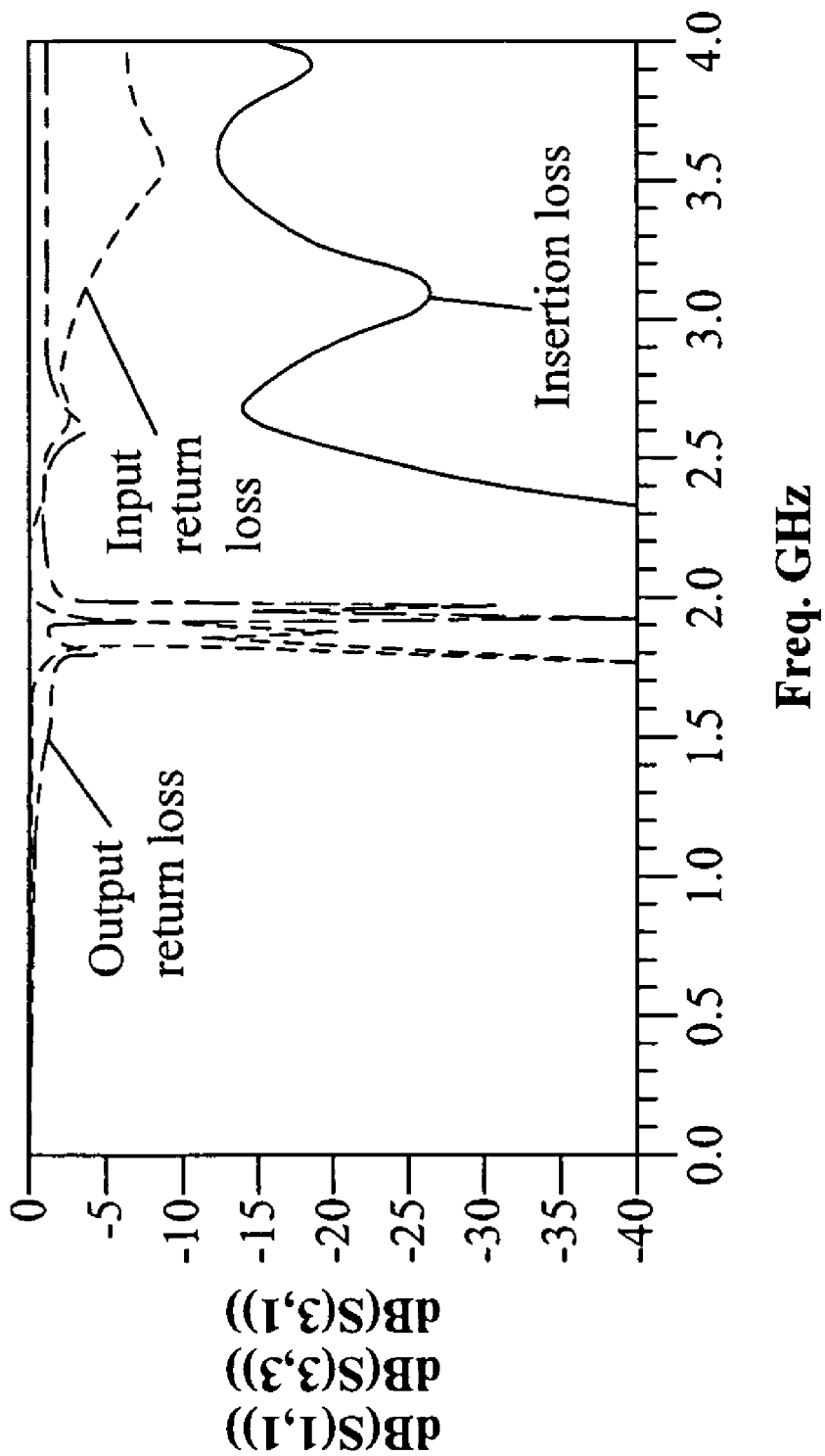
FIG. 15 is a plot illustrating a wide band perspective of S parameters for the multi-phase BAW L network having no more than two different resonator stack thicknesses on a substrate according to one embodiment of the invention.
Figure 16:
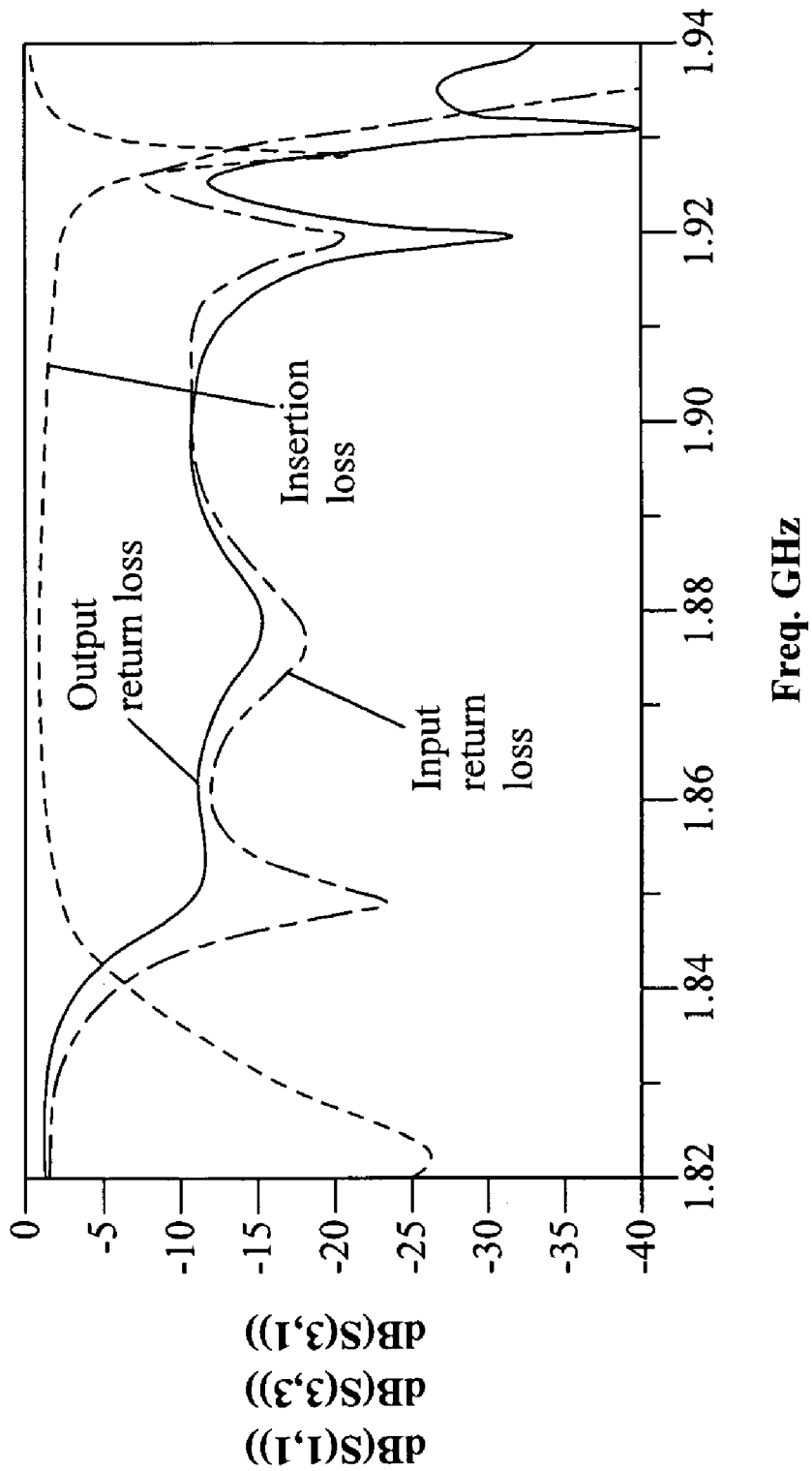
FIG. 16 is a plot illustrating a narrow band perspective of S parameters for the multi-phase BAW L network having no more than two different resonator stack thicknesses on a substrate according to one embodiment of the invention.

FIGS. 14-16 illustrate a simulation of a multi-stage BAW L network in which two resonator thicknesses are used in the manufacturing of the resonators. As shown in FIG. 14, an in-band impedance transformation from a 50Ω source impedance (Z5) to a 26Ω load impedance (Z1) is realized. The inability to achieve a full impedance transformation from 50Ω to 5Ω is caused by this particular implementation in which only two resonator thicknesses (i.e., 2 Fs/Fp realized) being manufactured on the corresponding substrate. Additionally, the mid-band impedance transformation is reversed. Although the full impedance transformation is not realized, this limited impedance transformation can reduce the number of necessary impedance matching elements on the circuit board by allowing the integration of the matching elements in an integrated circuit or module containing BAW filter substrates and Radio Frequency Integrated Circuit ("RFIC") substrates.

FIG. 15 provides a wide band perspective of insertion and return loss within the multi-stage BAW L network. FIG. 16 provides a narrow band perspective of the insertion and return loss of the same multi-stage BAW L network. One skilled in the art will recognize that a degraded insertion loss is realized in this particular implementation. A smaller impedance transformation shift is attained because return loss and insertion loss are not as well optimized with this simpler technology.

The return loss degrades because at mid band this version of the filter acts like an RF switch and presents the switch impedance to the output and vice versa, (i.e., impedance reversal). Insertion loss degrades as well with fewer degrees of resonator design freedom to optimize insertion loss at a given impedance transformation. Such a network can become less optimal than discrete tuning component networks, which is not the case with a higher number of different resonator stack thicknesses available for optimization. For example, as shown in FIGS. 15 and 16, an impedance transformation using only two BAW resonator stack thickness values will provide about 2 dB of insertion loss transforming from approximately 30Ω to 50Ω.

Figure 17:
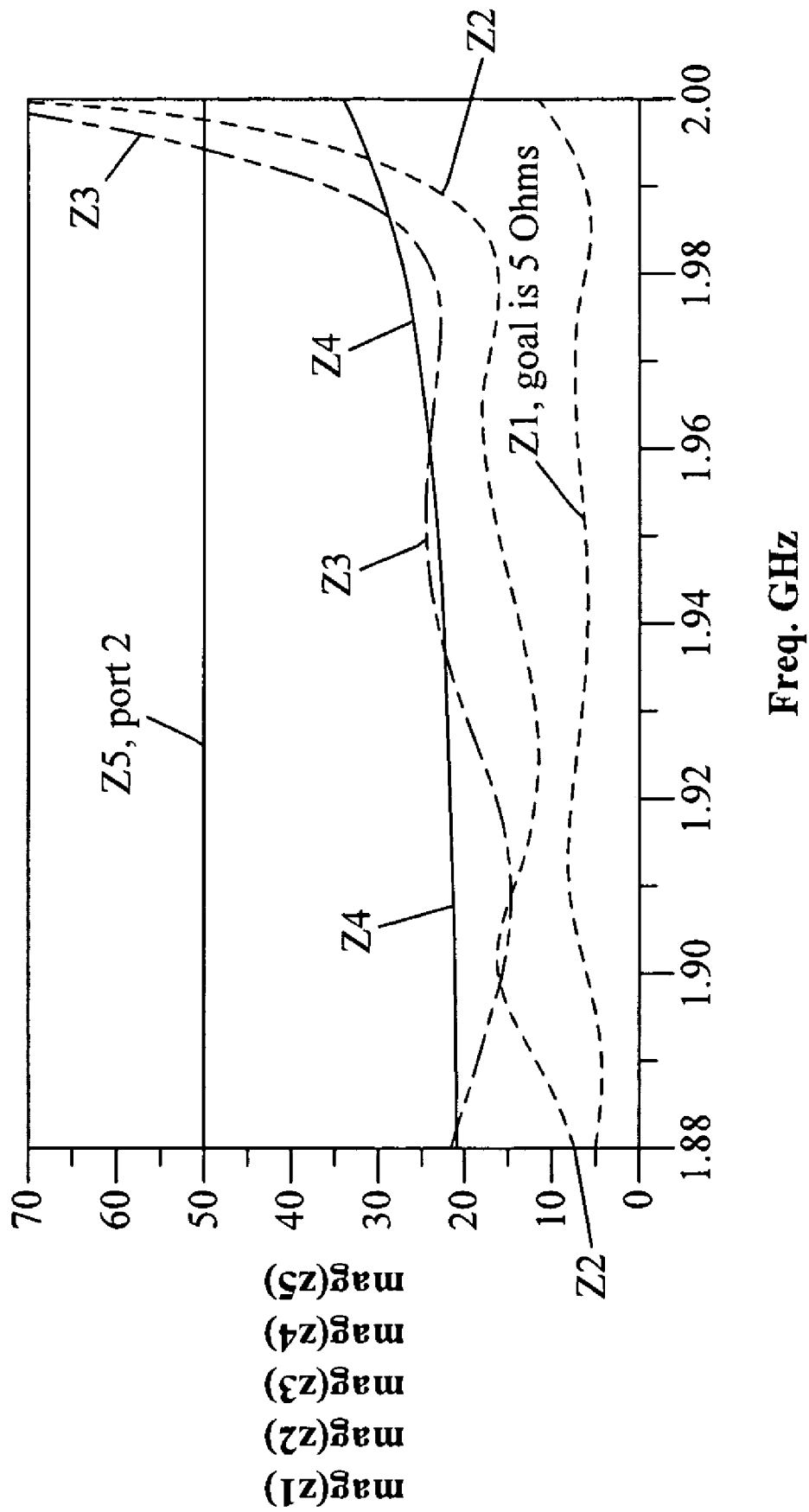
FIG. 17 is a plot illustrating a relationship between impedance and frequency relating to a multi-phase BAW L network manufactured having eight different resonator thicknesses and corresponding series resonant frequencies according to one embodiment of the invention.
Figure 18:
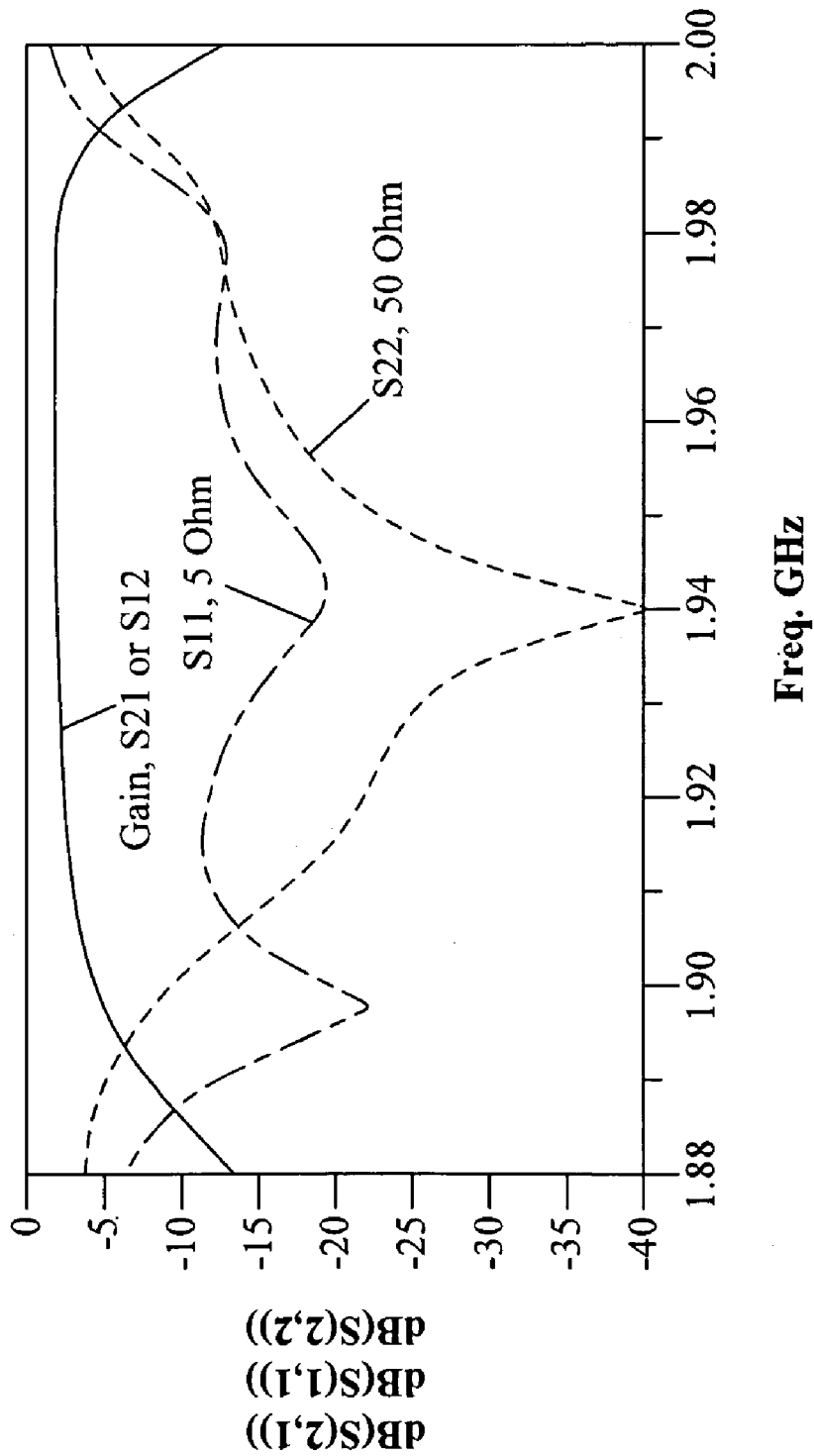
FIG. 18 is a plot illustrating a wide band perspective of S parameters for the multi-phase BAW L network having eight different resonator stack thicknesses on a substrate according to one embodiment of the invention.
Figure 19:
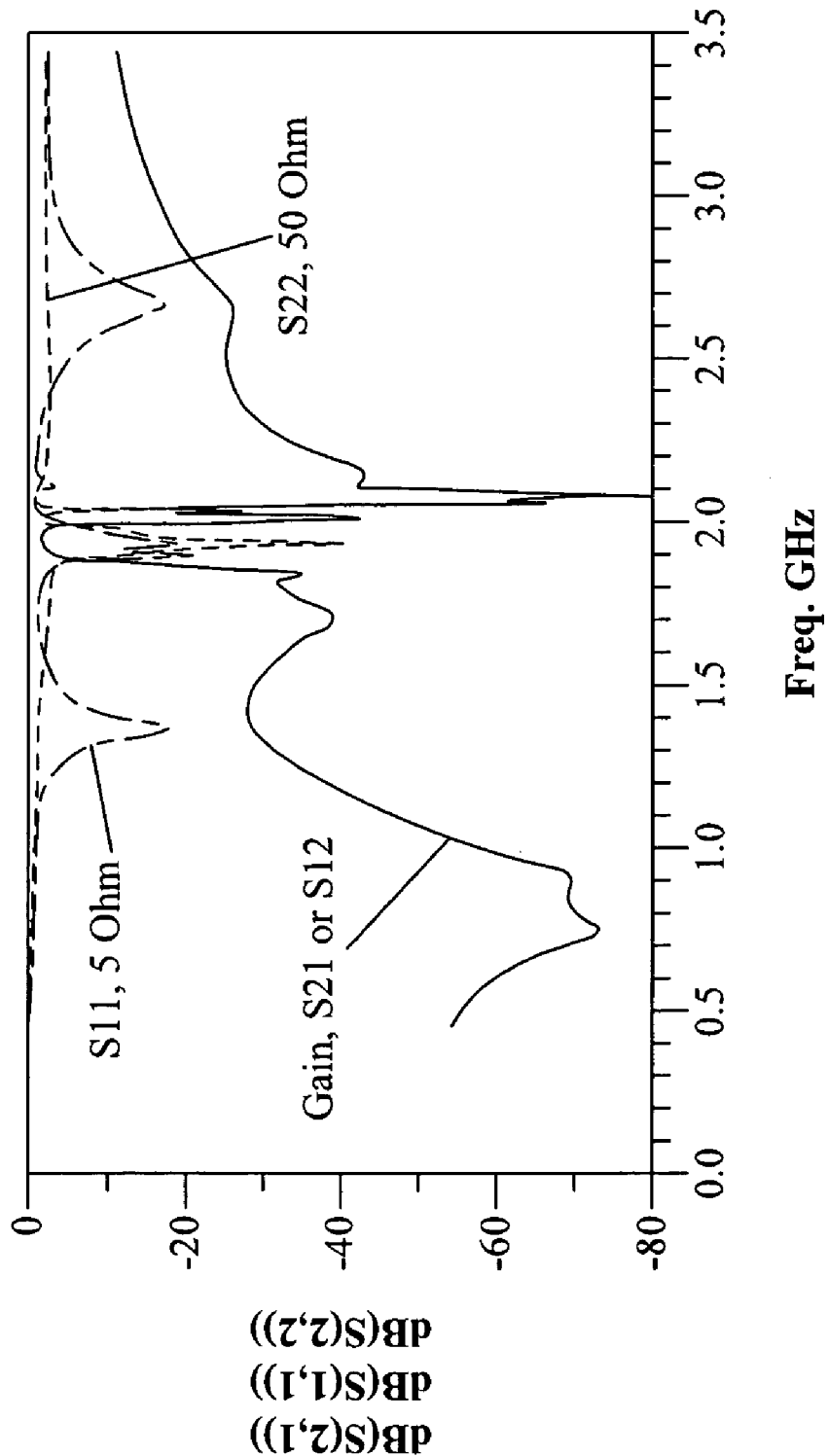
FIG. 19 is a plot illustrating a narrow band perspective of S parameters for the multi-phase BAW L network having eight different resonator stack thicknesses on a substrate according to one embodiment of the invention.

It is important to note that the manufacturing complexity increases as the number of unique resonator stack thicknesses are used within the multi-stage BAW L network. However, this increase in the number of unique thicknesses enhances the performance capability of the multi-stage BAW L network. FIGS. 17-19 simulate the performance of a multi-stage BAW L network having eight unique thicknesses resulting in four different series resonant frequencies within the multi-stage network.

In this particular simulation, for each stage 1210 1220 1230 1240 the series resonant frequency $F_s$ is about 3.3% higher than the resonant frequency of the shunt resonator. Cp values are chosen such that the series BAW motional inductance is low and the plate capacitance is high on the input impedance side (e.g., 5%). This insures lower impedance or higher admittance on the left most L stages to transform the lower impedance. Likewise, on the output impedance (e.g., 50%), higher motional inductance and lower plate capacitance is selected to transform the impedance. For example, "Development of Low-Loss Band-Pass Filters Using SAW Resonators for Portable Devices," by O. Ikata, et. al, published in 1992 Ultrasonics Symposium 1992 (1051-0117/92/0000-0111), which is incorporated by reference in its entirety, discusses in more detail the relationship between filter impedance and resonator capacitance and inductor.

It is desirable to avoid stacking the mid pass band $F_p$ shunt (and the $F_s$ series) for each stage at precisely the same frequencies as each other. Accordingly, all series resonators are not "thru" at the same frequency that all shunt resonators are open in band, but instead, some are low pass and some are high pass at the same mid band frequency. In other words, these $F_s$ series values were intentionally interspersed throughout the middle of the pass band to achieve a desirable performance.

For clarity of illustration, the following table discloses detailed equivalent circuit values used to generate FIGS. 17-19.

| Shunt_res.Fsr_MHz | Shunt_res.FPR_MHz | Shunt_res1.Cp_pF |
|---|---|---|
| 1976.573 | 2027.975 | 4.000 |
| Series_res1.Fsr_MHz | Series_res1.Fpr_MHz | Series_res1.Cp_pF |
| 2014.400 | 2066.785 | 7.800 |
| Shunt_res1.Fsr_MHz | Shunt_res1.Fpr_MHz | Shunt_res1.Cp_pF |
| 1950.048 | 2000.760 | 4.000 |
| Series_res2.Fsr_MHz | Series_res2.Fpr_MHz | Series_res2.Cp_pF |
| 1963.700 | 2014.767 | 2.000 |
| Shunt_res2.Fsr_MHz | Shunt_res2.Fpr_MHz | Shunt_res2.Cp_pf |
| 1900.968 | 1950.403 | 4.200 |
| Series_res3.Fsr_MHz | Series_res3.Fpr_MHz | Series_res3.Cp_pF |
| 2031.600 | 2084.433 | 2.100 |
| Shunt_res3.Fsr_MHz | Shunt_res3.Fpr_MHz | Shunt_res3.Cp_pf |
| 1966.699 | 2017.844 | 6.900 |

| Series_res.Lmotional_nh | Shunt_res1.Lmotional_nH |
|---|---|
| 15.797 | 4.491 |
| Series_res1.Lmotional_nh | Shunt_res1.Lmotional_nH |
| 15.190 | 31.607 |
| Series_res2.Lmotional_nh | Shunt_res2.Lmotional_nH |
| 62.339 | 39.677 |
| Series_res3.Lmotional_nh | Shunt_res3.Lmotional_nH |
| 55.468 | 18.014 |

Referring to FIG. 17, one skilled in the art will recognize the impedance transformation from 5Ω at Z1 to 50Ω at Z5. Furthermore, the impedance progression occurs without any impedance reversal at the mid-band of the pass band. So the impedance of Z5 does not approach 50 Ohms in mid band, but remains near 5 Ohms in FIG. 17. Contrariwise, FIG. 14 shows the 25 Ohm port seeing about 50 Ohms near (or slightly above) the middle of the passband, indicating impedance reversal.

FIGS. 18 and 19 show both a wide band and narrow band perspective of the S parameters of the multi-stage BAW network. One skilled in the art will recognize the improved insertion and return loss performance of this multi-stage network relative to the previously described network. In particular, mid band return loss is very good (indicating a lack of impedance reversal) and impedance is fairly well controlled within the passband.

While a four stage implementation of the multi-stage BAW network has been described, one skilled in the art will recognize that the number of stages within the network may vary depending on the desired specifications of impedance transformation and filtering. Furthermore, although the BAW stages have been described in an L configuration, other configurations may be used; each offering various filtering and impedance transformation characteristics. For example, a Pi network may be used to transform impedance if the shunt BAW resonators are asymmetrical, providing a different shunt impedance at one port versus the other port. Likewise, asymmetrical Tee networks may also be used for BAW impedance transformation without coupled resonators. Additionally, differential lattice configurations may be used to realize an impedance transformation.

The present invention is not limited to power amplifiers and transmit signal path applications. For example, the invention may be applied to the receive-side duplexer to noise match the antenna (e.g., a 50Ω impedance) to a low noise amplifier (e.g., a 200-j20Ω impedance).

The present invention may also be used to obtain reasonable arbitrary reactive matches. Typically, an inductive match is used to cancel the output or input capacitance of a power amplifier, power amp driver or low noise amplifier. However, this inductive match may be accomplished by either temporarily adding the conjugate of the desired porting impedance and retuning $R_s$ and $F_p$ to realize the previous response, or by tuning with the active circuit or other circuit requiring reactive matching to facilitate the synthesis of the new desired BAW network.

D. Harmonic Termination

A power amplifier or other RF circuit contains an undesirable output or input parasitic capacitance that may complicate the impedance characteristics of the matching network at a particular frequency or frequency range. In the case of a power amplifier matching network, the power added efficiency of the amplifier may degrade as signal frequency increases. This output capacitance of a bipolar transistor is dominated by collector to base capacitance, or $C_{jc}$.

Figure 20:
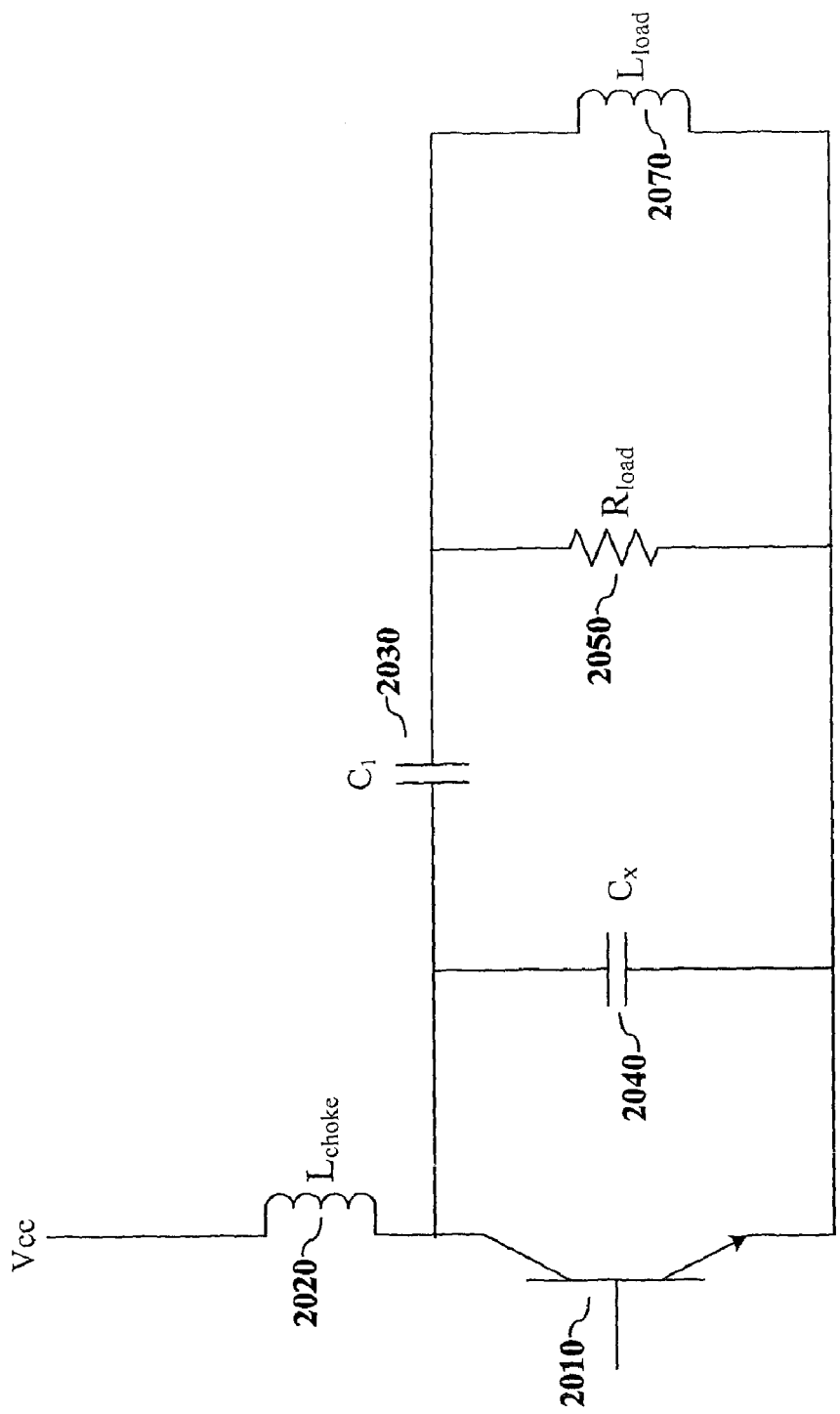
FIG. 20 is an exemplary illustration of a power amplifier output transistor that is coupled to a load.

FIG. 20 illustrates an exemplary circuit illustration of an output of a power amplifier transistor and matching network. (See RF Power Amplifiers for Wireless Communications, Steve C. Cripps, © 1999 Artech House, pages 38 & 52) In order to increase the efficiency of the power amplifier, it is desirable to minimize the amount of power dissipated across the output power transistor 2010. In particular, power dissipated at the output transistor 2010, and particularly across the transistor collector and emitter, reduces the total amount of power provided from the amplifier, which reduces the amplifier's collector efficiency.

In this particular illustration, the power amplifier is driving a load having a corresponding resistance $R_{LOAD}$ 2050, internal capacitance $C_x$ 2040 and inductance $L_{LOAD}$ 2070. The power amplifier output transistor 2010 is provided power from a power supply and inductor choke ($L_{CHOKE}$) 2020 that effectively increases the amount of power transmitted by the amplifier transistor 2010. In common examples, this inductive choke approximately doubles the voltage swing provided to the collector on the output transistor 2010 from the power source ($V_{cc}$) compared to that provided by a fully resistive collector DC bias.

Across the transistor collector and emitter of the transistor 2010, it is desirable to have voltage and current square waveforms with short rise and fall times that are aligned. This alignment reduces the amount of power that is dissipated across the collector and emitter. Comparatively, if residual voltage remains at the collector above the emitter while current is flowing from collector to emitter, then power will be dissipated in the transistor and the amplifier efficiency will fall.

The equivalent internal capacitance $C_x$ 2040, across the transistor 2010 collector and emitter (primarily due the Miller Effect of $C_{jc}$ between collector and base), may cause an undesirable lowpass response which adversely affects the power gain at a desired operating frequency. Furthermore, the signal voltage and current waveforms for the power delivered into the load, including the impact of a matching element or network, may be misshaped and not operating at a preferred efficiency level.

Harmonic termination is intended to improve the efficiency of the matching network and power amplifier at a particular frequency or frequency range. In effect, the output capacitance of the transistor network is supplemented in such a manner to provide an acceptable harmonic termination resulting in improved impedance termination characteristics at the desired harmonic frequency, while providing at the same time the desired impedance transformation at the fundamental frequency. In particular, certain harmonics of signal across the collector and emitter are shorted so that the signal is "squared-up".

The current and voltage waveforms also need to be 180 degrees out of phase of each other. This second requirement is usually less difficult to achieve than the "squaring up" requirement, but may require minor adjustment to optimize in the final tuning once the harmonic termination and fundamental frequency impedance transformation are in order. If a voltage signal is being addressed, then even harmonics are removed using a harmonic short so that the voltage signal's square wave shape is improved. For example, second harmonic termination may be applied to improve saturating power amplifier performance such as in a Global System for Mobile communication ("GSM") scenario. Comparatively, if a current signal is being addressed, then odd voltage harmonics are removed using an odd harmonic short so that the current signal's square wave shape is improved. For example, third harmonic termination may be best suited for Wide-Band Code Division Multiple Access ("WCDMA") and Code Division Multiple Access ("CDMA") signals. One skilled in the art will recognize that higher order harmonic termination may also be achieved using the principles of the present invention to improve the PA performance of various types of multiple access standard applications, such as GSM, wireless local area network ("WiLAN"), etc.

Figure 21A:
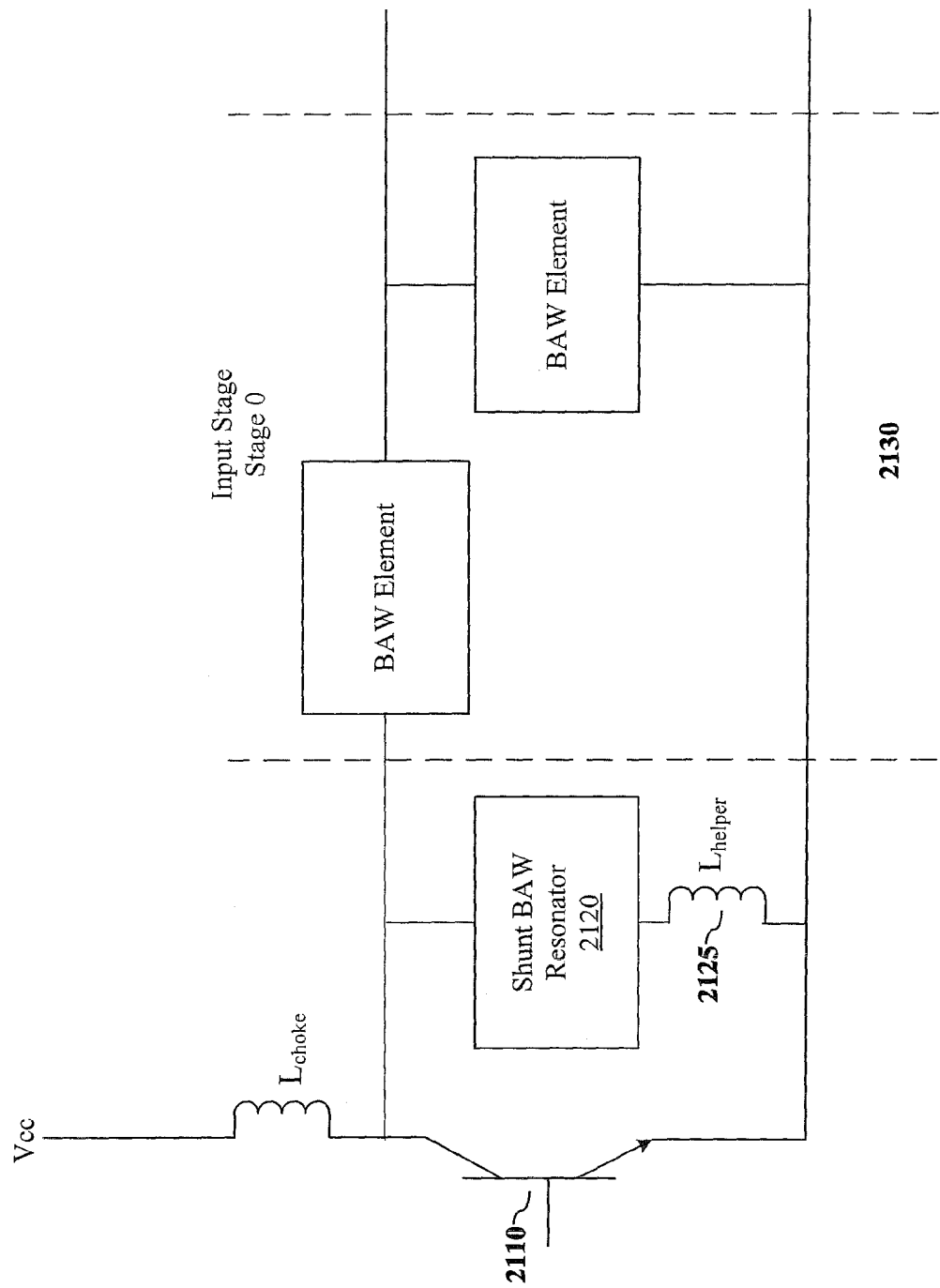
FIG. 21A is an illustration of harmonic termination within a BAW resonator network according to one embodiment of the invention.

Various embodiments of the invention provide harmonic termination within a BAW matching element or a pre-matching element that interfaces with a BAW matching element. This harmonic termination principle may be applied to various types of BAW matching networks including L, Pi and Tee multi-stage networks. FIG. 21A illustrates a power amplifier output transistor 2110 coupled to a plurality of BAW elements in which both impedance transformation and harmonic termination are realized. A shunt BAW resonator 2120 is coupled in parallel with the output transistor 2110 between its collector and emitter. A helper inductor 2125 is coupled in series with the shunt BAW resonator 2120 as illustrated in the Figure. The helper inductor 2125 and the shunt BAW resonator 2120 are selected to produce a short at the desired harmonic frequency. Depending on the application, this short may be at an even harmonic frequency or frequencies if applied to a voltage signal or at an odd frequency or frequencies if applied to a current signal.

A BAW impedance matching network is coupled in parallel with the output transistor 2110 and the shunt BAW element 2120. In the illustrated example, an input stage, stage 0 2130, of the BAW impedance matching network is shown. In light of the previous description, subsequent L stages may be included within the matching network in order to provide a certain impedance transgression through the matching network. Furthermore, the shunt BAW element 2120 and helper inductor 2125 may be used in Pi and Tee multi-stage matching networks.

The combination of the shunt BAW resonator 2120 and helper inductor 2125 may be used to provide a harmonic termination within a BAW matching element or pre-match element. The BAW resonator 2120 contains both parallel and series resonance and looks capacitive outside of these frequencies. The net capacitance of the non-resonating BAW resonator is supplemented with another resonating frequency because of its interaction with the helper inductor 2125. The helper inductor 2125 effectively resonates with the parallel plate capacitance of the BAW resonator 2120 in order to generate another resonating frequency outside of the resonators parallel and series resonance. These resonating frequencies provide harmonic termination and result in harmonic shorts depending on the design of both the shunt BAW resonator 2120 and helper inductor 2125.

Figure 21B:
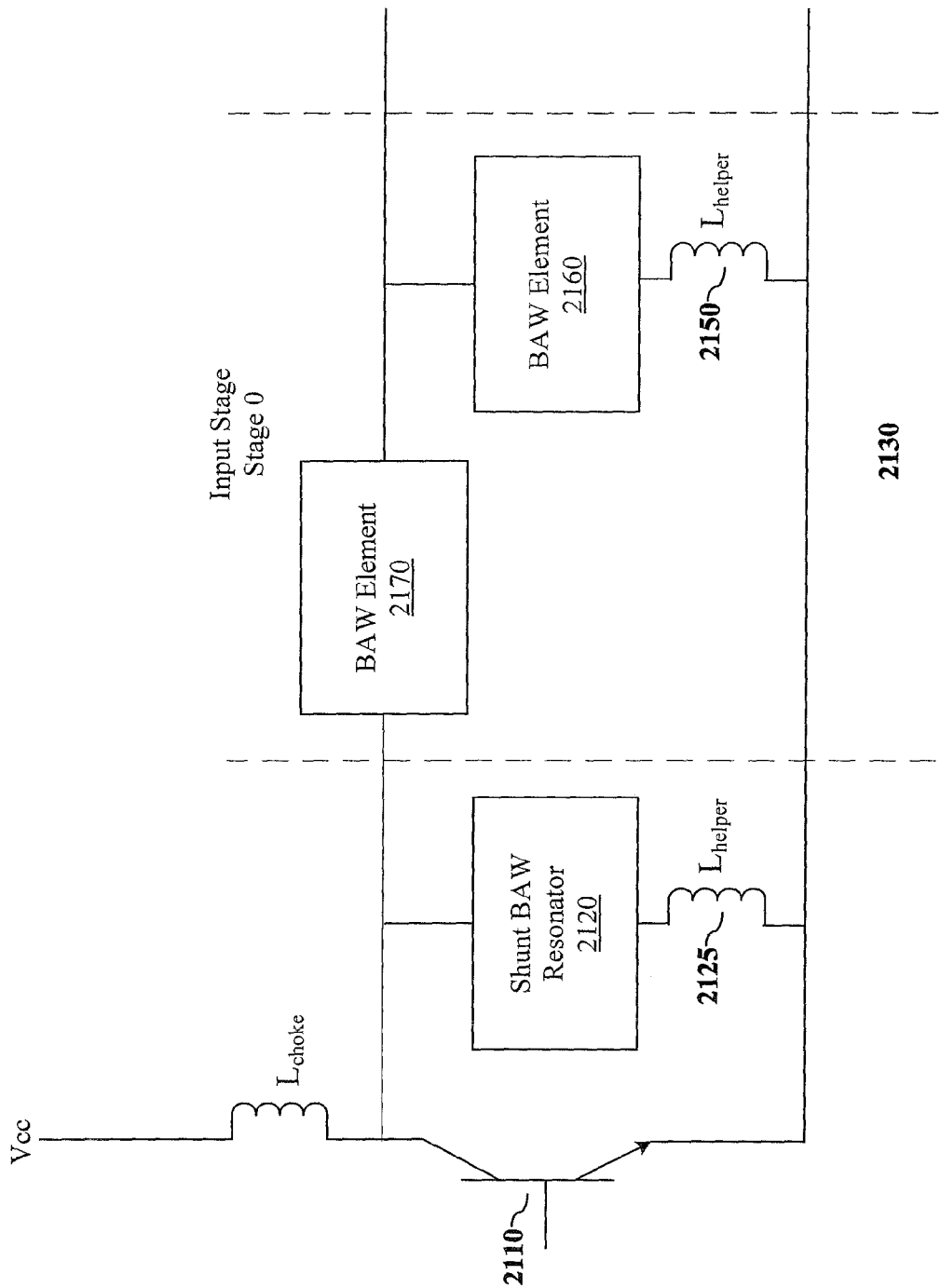
FIG. 21B is an illustration of harmonic termination within a BAW resonator network according to one embodiment of the invention.

FIG. 21B illustrates another embodiment of the invention in which a second helper inductor is inserted within an input stage of the impedance matching network. In this particular implementation, the second helper inductor 2150 is coupled within the input stage 2130 such that it is in series with a parallel BAW element 2160. This second helper inductor 2150 may help to address out-of-band rejection to avoid interference with other bands. For example, the second helper inductor may help 2150 prevent a CDMA transmitter from jamming a receiver operating on a wireless data channel. Accordingly, one skilled in the art will recognize that a harmonic short and/or helper inductor may potentially be integrated within other stages within the impedance matching network to further reduce unwanted interference in other bands.

Figure 21C:
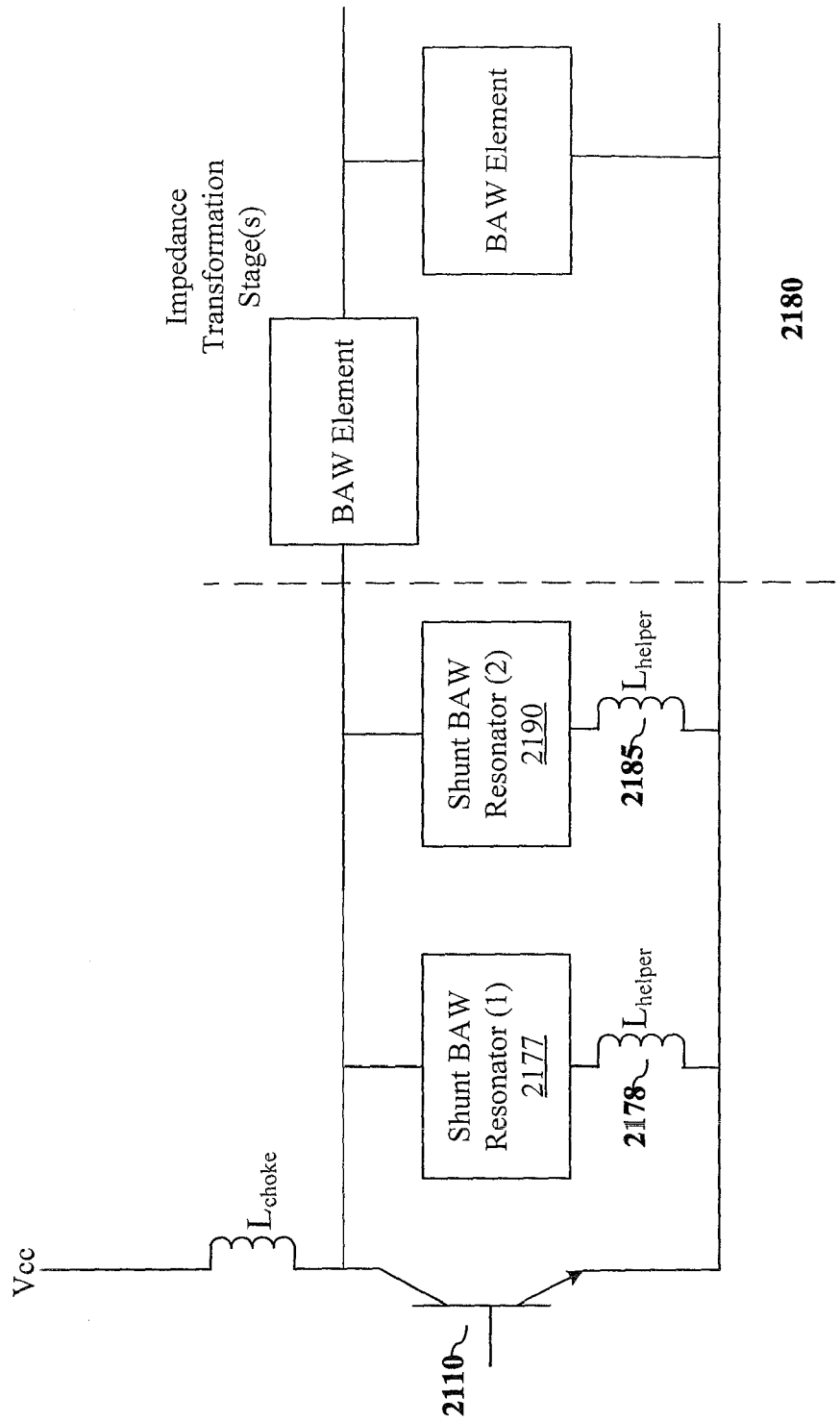
FIG. 21C is an illustration of dual harmonic termination within a BAW resonator network according to one embodiment of the invention.

FIG. 21C illustrates yet another embodiment of the invention in which two parallel shunt BAW resonators and associated helper inductors are inserted within an input stage of the impedance matching network. A first shunt BAW resonator 2177 and first helper inductor 2178 are coupled in series with the power amplifier output transistor 2110. A second shunt BAW resonator 2190 and a second helper inductor 2185 are also coupled in parallel with the power amplifier output transistor 2110. A BAW impedance transformation stage 2180 or stages are coupled in parallel with the two sets of BAW resonators and helper inductors.

Figure 22:
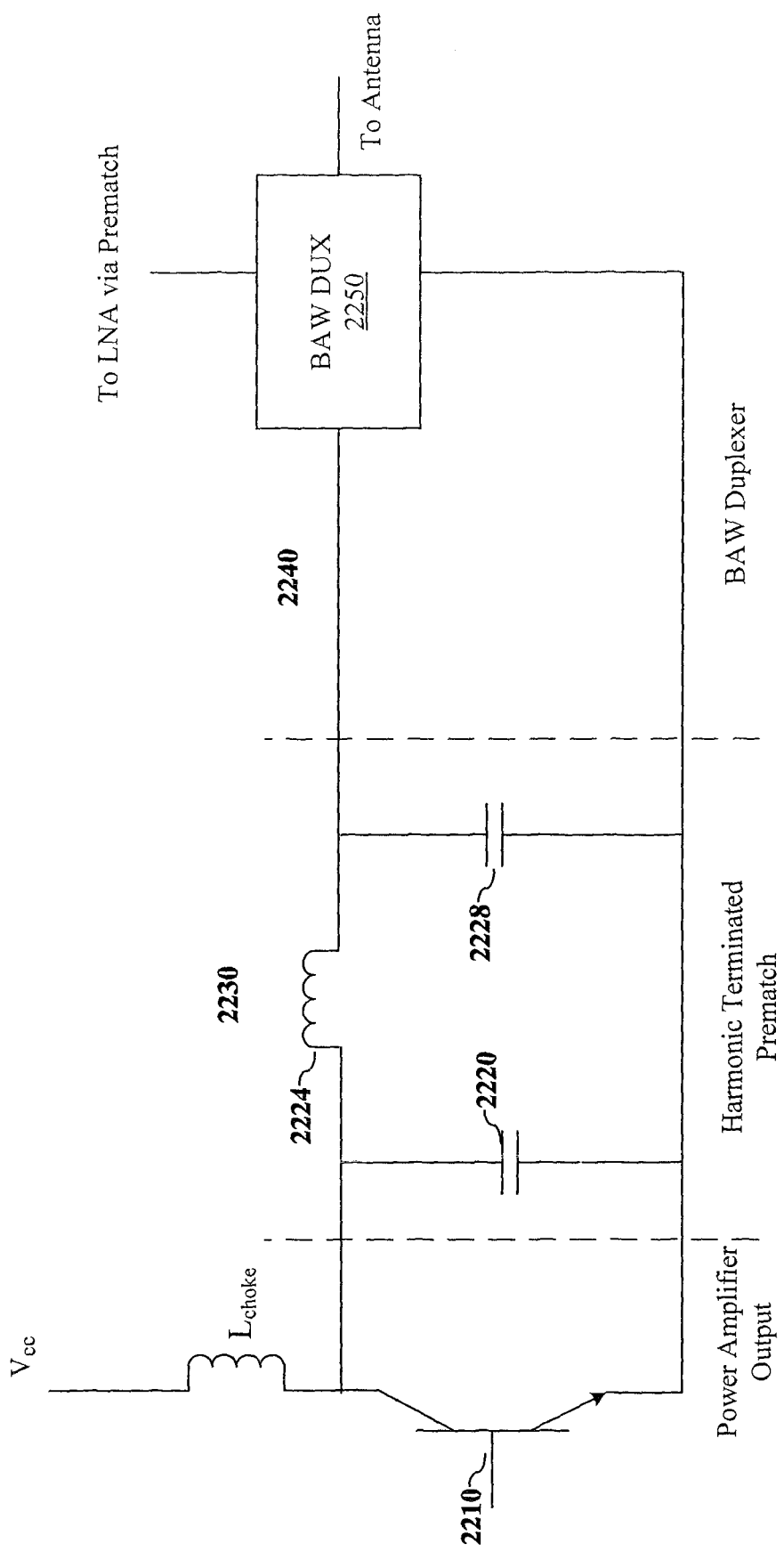
FIG. 22 is an illustration of harmonic termination within a prematch impedance transformation that interfaces with a BAW resonator network according to one embodiment of the invention.

The use of two shunt BAW resonators 2177, 2190 and two helper inductors 2178, 2190 generates two independent harmonic terminations. In one embodiment of the invention, the first shunt BAW resonator 2177 and the second shunt BAW resonator 2190 have approximately equal capacitance. Generally speaking, a harmonic short should be coupled directly to the power amplifier in order to properly short a waveform at the collector and improve the shape of the signal. This dual harmonic termination may improve the shaping of the voltage or current waveform at power amplifier collector by generating shorts at different harmonic frequencies. As a result, the collector receives a more defined voltage or current square wave FIG. 22 illustrates the application of harmonic termination to an impedance matching system in which impedance transformation occurs across a harmonic terminated prematch and a BAW element having internal impedance progression, such as the BAW duplexer previously described. According to one embodiment of the invention, impedance transformation within the BAW filter does not provide a sufficient impedance transformation because manufacturing constraints in building the BAW filter. As a result, an impedance prematch network 2230 on the circuit board or module is used to add additional impedance progression so that an appropriate match is realized.

As shown in the Figure, a power amplifier output transistor 2210 is coupled to a harmonic terminated prematch stage 2230 having a first impedance transformation. The prematch stage 2230 is coupled to a BAW duplexer stage 2240, having a BAW duplexer 2250, which provides a second impedance transformation. The first and second impedance transformation provides a sufficient impedance progression between the power amplifier and duplexer. In one embodiment of the invention, this first transformation occurs from 4+j1 Ohms at the output transistor 2210 collector to 28 Ohms at the output of the prematch stage 2230. The second transformation from 28 Ohms at the input BAW duplexer 2240 to 50 Ohms at a coupled antenna.

An inductor 2224 and first capacitor 2228 within the prematch stage 2230 provide this first impedance transformation. A second capacitor 2220, coupled in parallel with the power output transistor 2210, in the context of first capacitor 2228 and inductor 2224, provides harmonic termination within the prematch stage 2230. This second capacitor 2220 may be integrated on chip or be a discrete component depending on various design factors. To some extent, the value of second capacitor 2220 depends upon the equivalent parasitic capacitor $C_x$ of the power output transistor 2210. The higher the $C_x$, the smaller value of capacitor 2220 should be used. For example, it may be desired to have the second capacitor 2220 a discrete component so that it may be tuned during the design process. As previously discussed, the second capacitor 2220 helps provide a harmonic short on the signal at the power output transistor 2210. This harmonic short may be designed to occur on even or odd harmonics and may also involve a relatively higher order harmonic.

One skilled in the art will recognize that harmonic termination and BAW impedance transformation may be applied to various different types of technologies and numerous circuits. The above-described embodiments are intended to be exemplary and not limiting in the applications available of the embodiments of the present invention.

The foregoing description of the invention has been described for purposes of clarity and understanding. It is not intended to limit the invention to the precise form disclosed. Various modifications may be possible within the scope and equivalence of the appended claims.

We claim:

1. A BAW resonator impedance transformation path, comprising:
 a power amplifier output transistor, having a collector and emitter, that provide power to a load through a BAW resonator impedance transformation network;
 a prematch impedance transformation stage, coupled in parallel to the power amplifier output transistor, that provides a first impedance transformation and having a harmonic termination capacitor;
 a BAW duplexer, coupled in parallel to the prematch impedance transformation stage, that contains an integrated BAW resonator impedance transformation network that provides a second impedance transformation; and
 an output coupled to communicate with an antenna.

2. The BAW resonator impedance transformation path of claim 1 wherein the harmonic termination capacitor is integrated within an integrated circuit of the prematch impedance transformation stage.

3. The BAW resonator impedance transformation path of claim 1 wherein the harmonic termination capacitor is a discrete electrical component on a board.

4. The BAW resonator impedance transformation path of claim 1 wherein the first impedance transformation is from approximately 4+j1 ohms to 28 ohms, and the second impedance transformation is from 28 ohms to 50 ohms.

5. The BAW resonator impedance transformation path of claim 1 wherein the integrated BAW resonator impedance transformation network is a multi-stage BAW resonator network, each stage provided in an L configuration.

6. The BAW resonator impedance transformation path of claim 5 wherein the multi-stage BAW resonator network is limited to two BAW resonator stack thicknesses.

7. The BAW resonator impedance transformation path of claim 1 wherein the harmonic termination capacitor provides a short for at least one even harmonic frequency to an electrical signal at the power amplifier output transistor.

8. The BAW resonator impedance transformation path of claim 1 wherein the harmonic termination capacitor provides a short for at least one odd harmonic frequency to an electrical signal at the power amplifier output transistor.

* * * * *